United States Patent
Hsiao et al.

(10) Patent No.: US 12,027,609 B2
(45) Date of Patent: *Jul. 2, 2024

(54) GATE STRUCTURE OF SEMICONDUCTOR DEVICE AND METHOD OF FORMING SAME

(71) Applicant: Taiwan Semiconductor Manufacturing Co., Ltd., Hsinchu (TW)

(72) Inventors: Ru-Shang Hsiao, Jhubei (TW); Ying Ming Wang, Tainan (TW); Ying Hsin Lu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/815,682

(22) Filed: Jul. 28, 2022

(65) Prior Publication Data

US 2022/0367671 A1    Nov. 17, 2022

Related U.S. Application Data

(63) Continuation of application No. 16/899,851, filed on Jun. 12, 2020, now Pat. No. 11,450,758.

(51) Int. Cl.
*H01L 29/66* (2006.01)
*H01L 21/8234* (2006.01)
(Continued)

(52) U.S. Cl.
CPC .. *H01L 29/6681* (2013.01); *H01L 21/823431* (2013.01); *H01L 21/823437* (2013.01); *H01L 29/41791* (2013.01); *H01L 29/785* (2013.01)

(58) Field of Classification Search
CPC .......... H01L 29/6681; H01L 29/41791; H01L 29/785; H01L 21/823431; H01L 21/823437
See application file for complete search history.

(56) References Cited

U.S. PATENT DOCUMENTS 10,153,353 B1    12/2018   Liou et al.
11,450,758 B2 *   9/2022   Hsiao ............ H01L 29/785
(Continued)

FOREIGN PATENT DOCUMENTS

CN    105845578 A    8/2016
CN    106328711 A    1/2017
(Continued)

*Primary Examiner* — Christine A Enad
(74) *Attorney, Agent, or Firm* — Slater Matsil, LLP

(57) ABSTRACT

A semiconductor device and a method of forming the same are provided. A method includes forming a fin extending from a substrate. A sacrificial gate electrode layer is formed along a sidewall and a top surface of the fin. A patterning process is performed on the sacrificial gate electrode layer to form a sacrificial gate electrode. A reshaping process is performed on the sacrificial gate electrode to form a reshaped sacrificial gate electrode. The reshaped sacrificial gate electrode includes a first portion along the top surface of the fin and a second portion along the sidewall of the fin. A width of the first portion decreases as the first portion extends from a top surface of the first portion toward the top surface of the fin. A width of the second portion decreases as the second portion extends from the top surface of the fin toward the substrate.

20 Claims, 26 Drawing Sheets

(51) Int. Cl.
    *H01L 29/417*    (2006.01)
    *H01L 29/78*    (2006.01)

(56) References Cited

U.S. PATENT DOCUMENTS

| | | |
|---|---|---|
| 2009/0057771 A1 | 3/2009 | Fukasaku |
| 2013/0193513 A1 | 8/2013 | Bryant et al. |
| 2016/0111531 A1 | 4/2016 | Dong |
| 2016/0225764 A1 | 8/2016 | Chang et al. |
| 2017/0005005 A1 | 1/2017 | Chen et al. |
| 2017/0012047 A1 | 1/2017 | Basker et al. |
| 2017/0098711 A1 | 4/2017 | Hsiao et al. |
| 2017/0179117 A1 | 6/2017 | Chang et al. |
| 2017/0330955 A1 | 11/2017 | Rahhal-Orabi et al. |
| 2018/0175030 A1 | 6/2018 | Chang et al. |
| 2018/0254338 A1 | 9/2018 | Kim et al. |
| 2018/0308979 A1 | 10/2018 | Wu et al. |
| 2018/0342600 A1 | 11/2018 | Chang et al. |
| 2018/0350934 A1 | 12/2018 | Liou et al. |
| 2019/0386115 A1* | 12/2019 | Lin .................. H01L 21/32139 |
| 2020/0006527 A1 | 1/2020 | Lin et al. |
| 2020/0220006 A1 | 7/2020 | Yang et al. |

FOREIGN PATENT DOCUMENTS

| | | |
|---|---|---|
| CN | 106560931 A | 4/2017 |
| CN | 106898610 A | 6/2017 |
| CN | 107004708 A | 8/2017 |
| CN | 110610859 A | 12/2019 |
| KR | 20170004827 A | 1/2017 |
| KR | 20170097006 A | 8/2017 |
| TW | 201924051 A | 6/2019 |

\* cited by examiner

US 12,027,609 B2

GATE STRUCTURE OF SEMICONDUCTOR DEVICE AND METHOD OF FORMING SAME

PRIORITY CLAIM AND CROSS-REFERENCE

This application is a continuation of U.S. patent application Ser. No. 16/899,851, filed on Jun. 12, 2020, now U.S. Pat. No. 11,450,758, issued Sep. 20, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
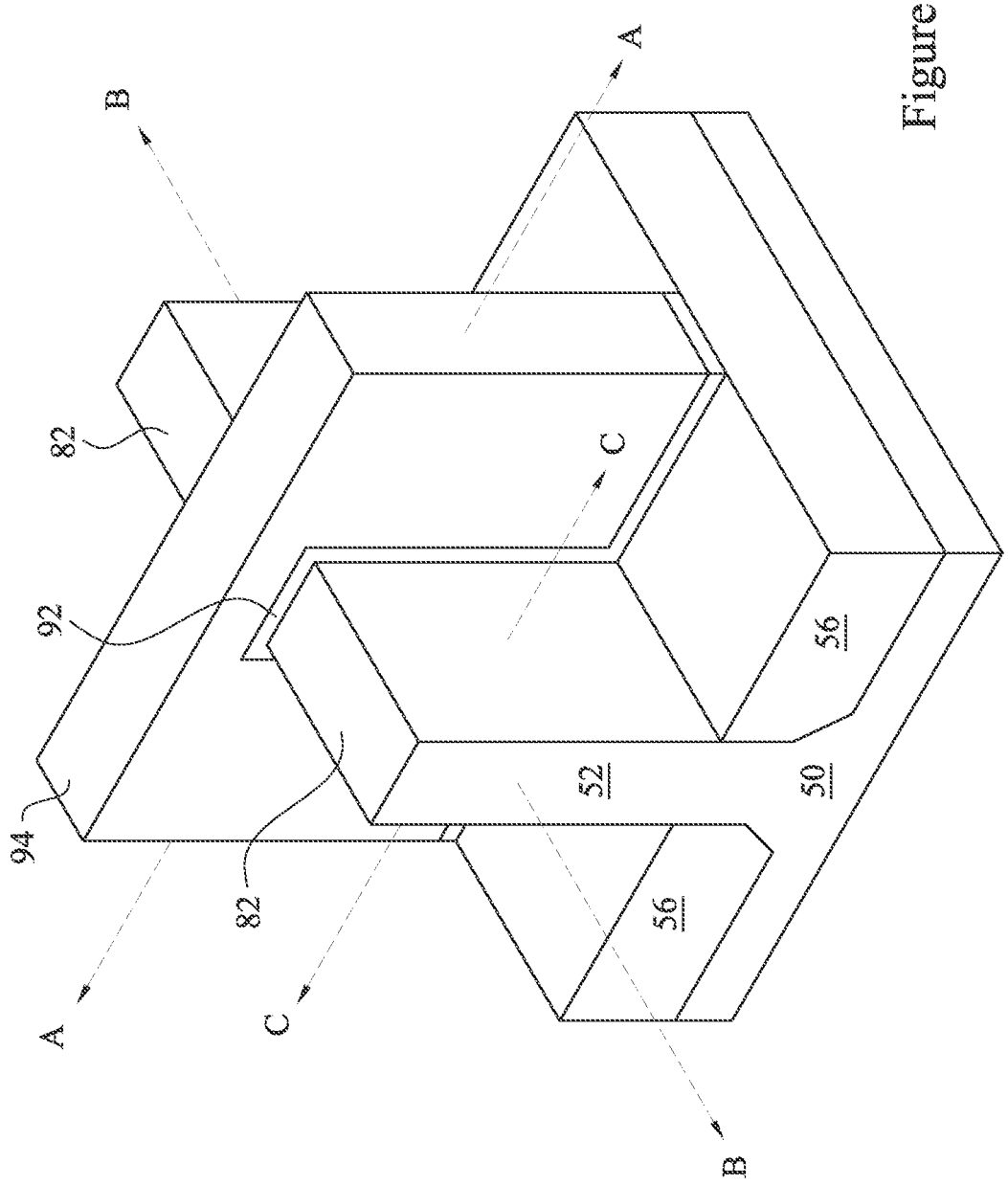
FIG. 1 illustrates an example of a FinFET in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a gate structure of a semiconductor device and a method of forming the same. Various embodiments presented herein are discussed in the context of a FinFET device formed using a gate-last process. Various embodiments discussed herein allow for forming and reshaping a sacrificial gate. In some embodiments, a reshaping method allows for reducing or eliminating polymer residues at a foot of the sacrificial gate and reshaping the sacrificial gate to have a profile with a top portion being wider than a lower portion. In some embodiments, such a profile improves gap filling characteristic such as, for example, a gap filling rate while forming a replacement gate in place of the sacrificial gate, avoids shorting between the replacement gate and subsequently formed source/drain contacts, reduces a gate resistance, increases a device speed, and improves a device yield.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and the gate electrode 94. FIG. 1 further illustrates reference cross-sections that are used in later figures. Cross-section A-A is along a longitudinal axis of the gate electrode 94 and in a direction, for example, perpendicular to a direction of a current flow between the source/drain regions 82 of the FinFET. Cross-section B-B is perpendicular to cross-section A-A and is along a longitudinal axis of the fin 52 and in a direction of, for example, the current flow between the source/drain regions 82 of the FinFET. Cross-section C-C is parallel to cross-section A-A and extends through the source/drain region 82 of the FinFET. Subsequent figures refer to these reference cross-sections for clarity.

FIGS. 2, 3, 4, 5, 6, 7, 8A, 8B, 9A, 9B, 10A, 10B, 10C, 11A, 11B, 11C, 12A, 12B, 13A, 13B, 13C, 13D, 14A, 14B, 15A, 15B, 16A, 16B, 17A, 17B, 17C, 18A, 18B, 19A, 19B, 20A, 20B, and 20C are cross-sectional views of intermediate stages in the manufacturing of a FinFET device in accordance with some embodiments. FIGS. 2 through 7 illustrate cross-sectional views along the reference cross-section A-A illustrated in FIG. 1, except for multiple fins/FinFETs. FIGS. 8A-20A are illustrated along the reference cross-section A-A illustrated in FIG. 1. FIGS. 8B-20B, 10C, 11C, 17C, and 20C are illustrated along the reference cross-section B-B illustrated in FIG. 1, except for multiple fins/FinFETs. FIGS. 13C and 13D are illustrated along the reference cross-section C-C illustrated in FIG. 1, except for multiple fins/FinFETs.

Figure 2:
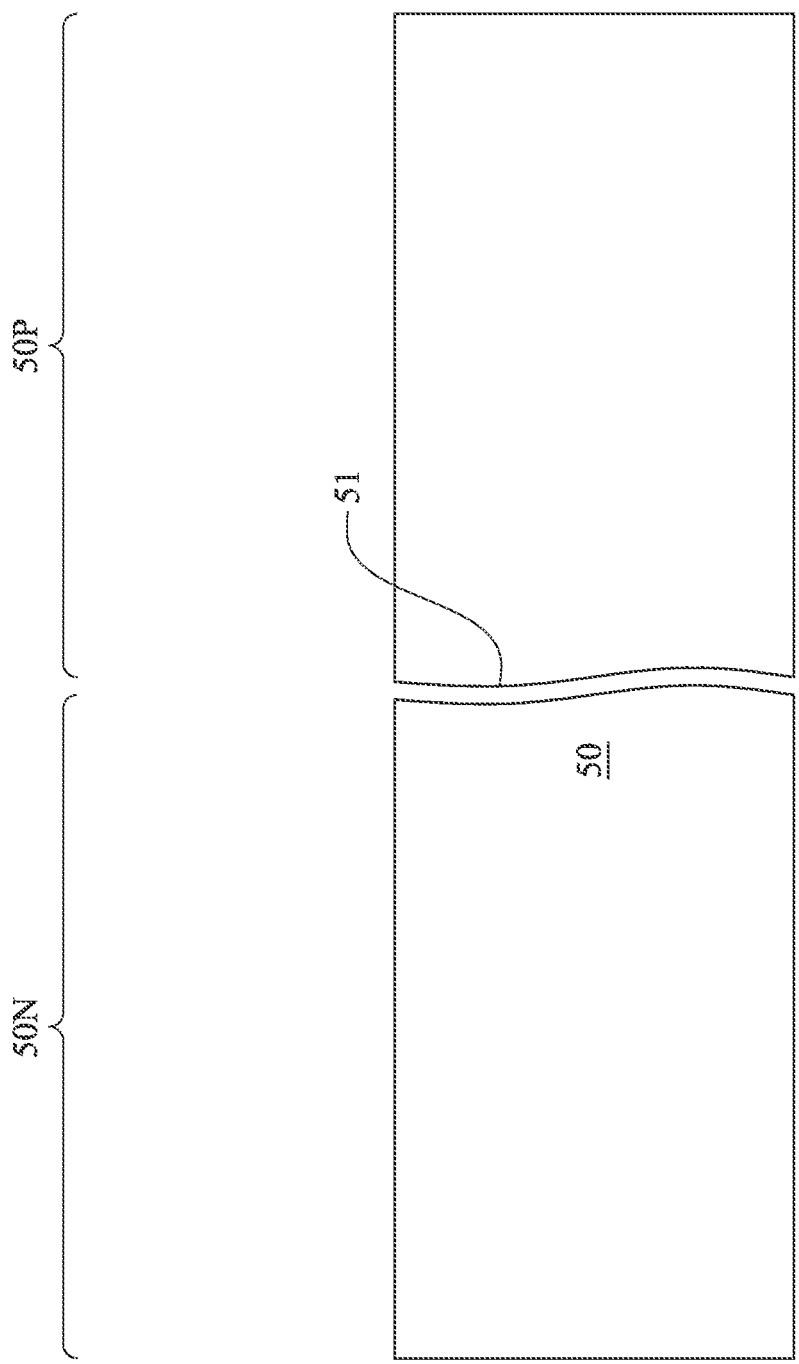
FIGS. 2, 3, 4, 5, 6, 7, 8A, 8B, 9A, 9B, 10A, 10B, 10C, 11A, 11B, 11C, 12A, 12B, 13A, 13B, 13C, 13D, 14A, 14B, 15A, 15B, 16A, 16B, 17A, 17B, 17C, 18A, 18B, 19A, 19B, 20A, 20B, and 20C are cross-sectional views of intermediate stages in the manufacturing of a FinFET device in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by a divider 51), and any number of device features (e.g., other active devices, doped regions, isolation structures, etc.) may be disposed between the region 50N and the region 50P.

Figure 3:
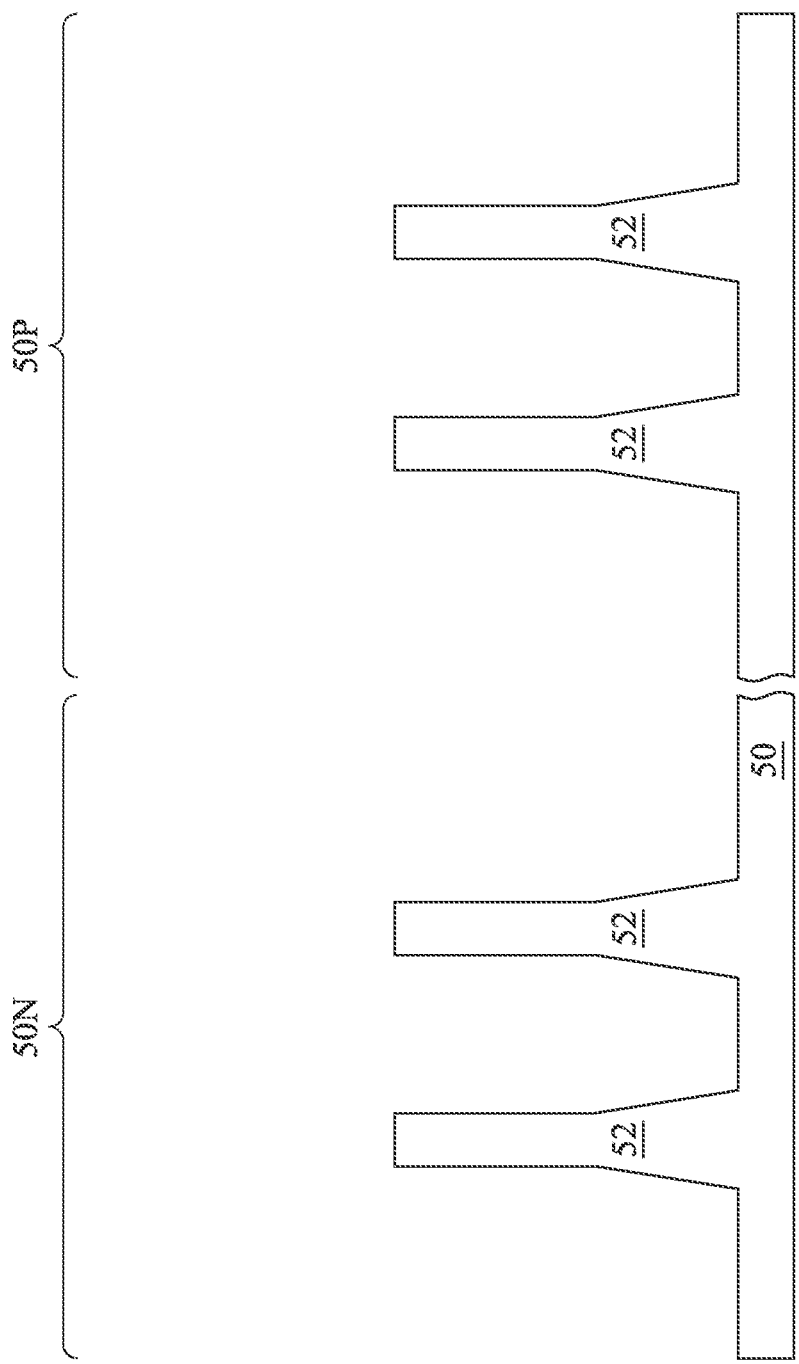

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), a combination thereof, or the like. The etch process may be anisotropic.

The fins may be formed by any suitable method. For example, the fins may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to form the fins.

Figure 4:
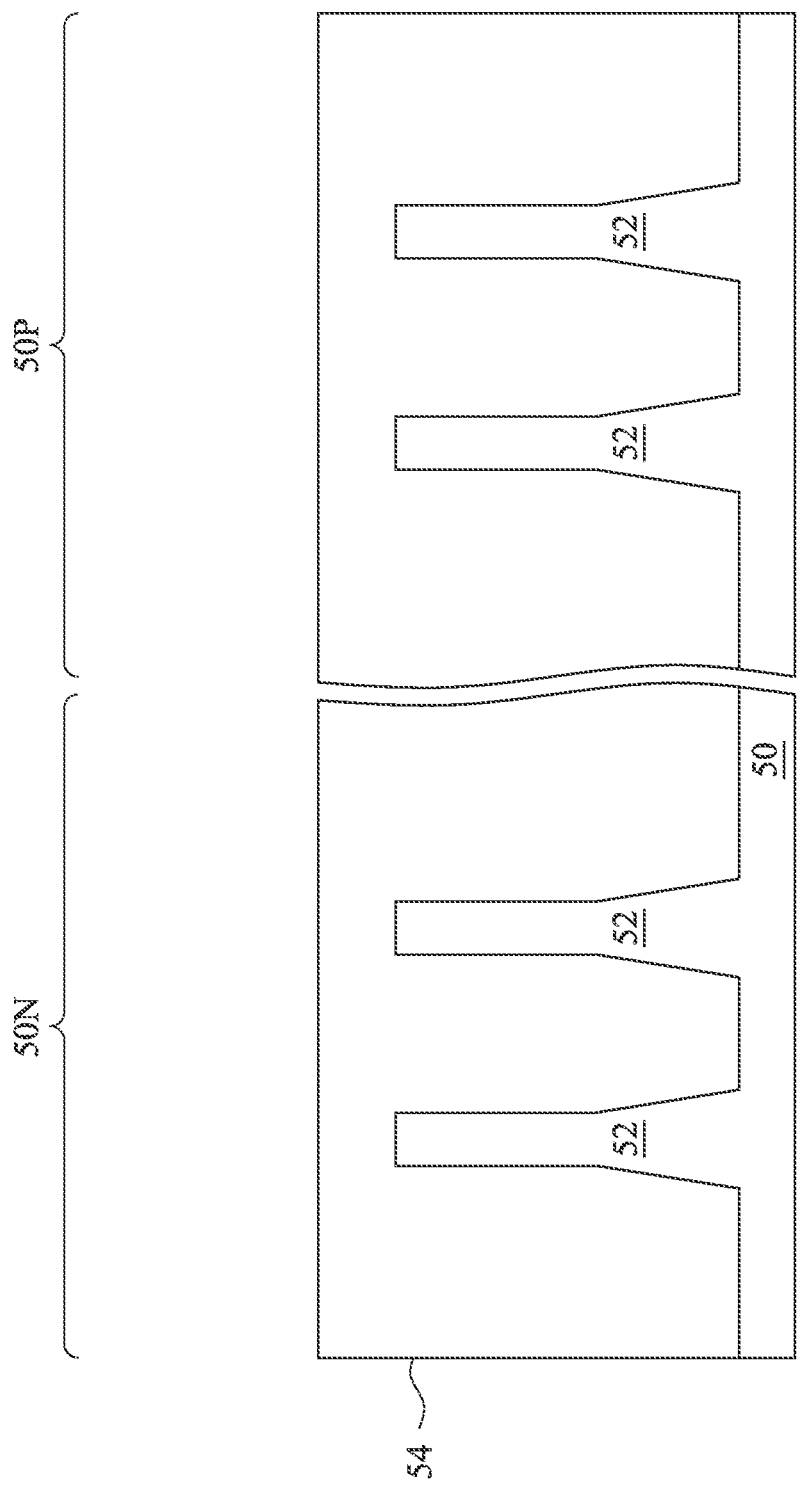

In FIG. 4, an insulation material 54 is formed over the substrate 50 and between neighboring fins 52. The insulation material 54 may be an oxide, such as silicon oxide, a nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments, a liner (not shown) may first be formed along surfaces of the substrate 50 and the fins 52. Thereafter, a fill material, such as those discussed above may be formed over the liner.

Figure 5:
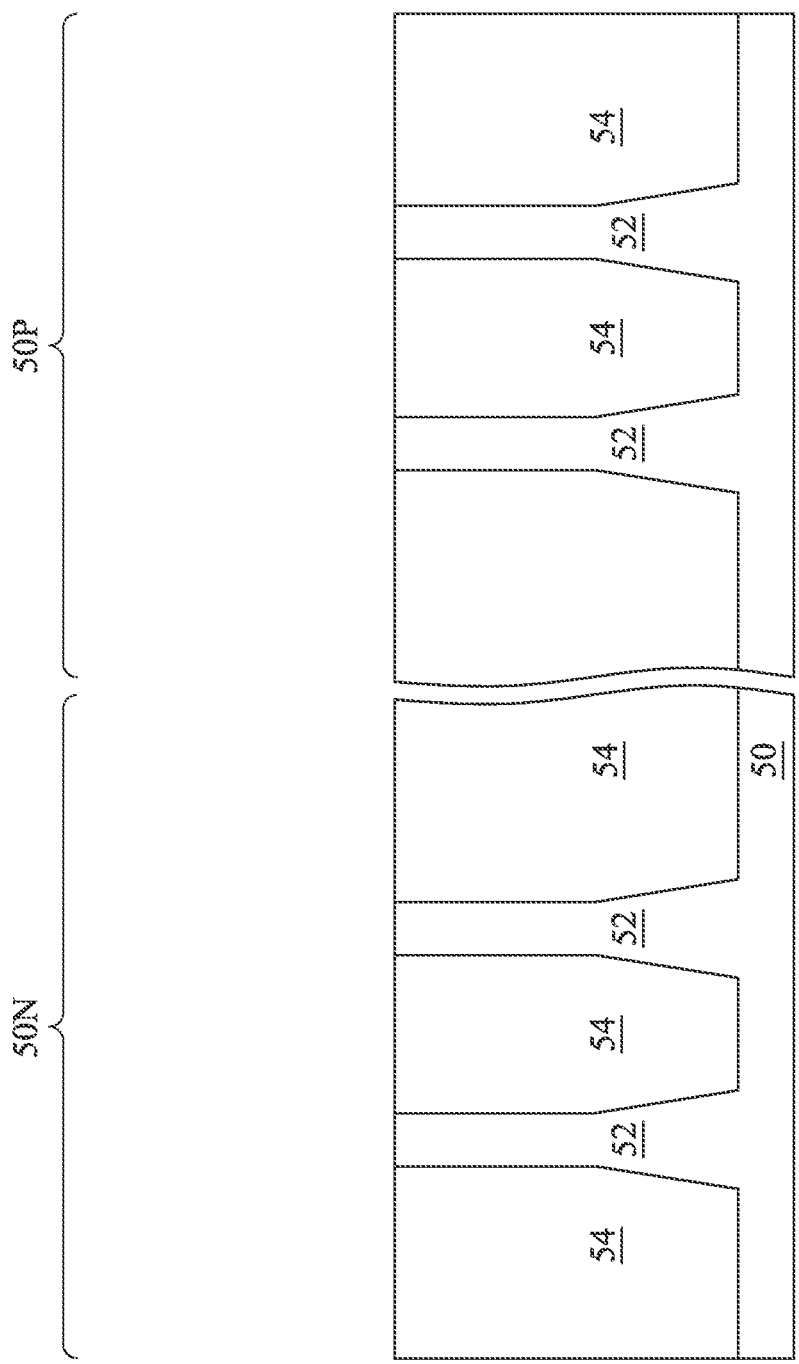

In FIG. 5, a removal process is applied to the insulation material 54 to remove excess portions of the insulation material 54 over the fins 52. In some embodiments, a planarization process, such as a chemical mechanical polish (CMP) process, an etch back process, combinations thereof, or the like, may be utilized. The planarization process exposes the fins 52 such that top surfaces of the fins 52 and the top surface of the insulation material 54 are level after the planarization process is completed.

Figure 6:
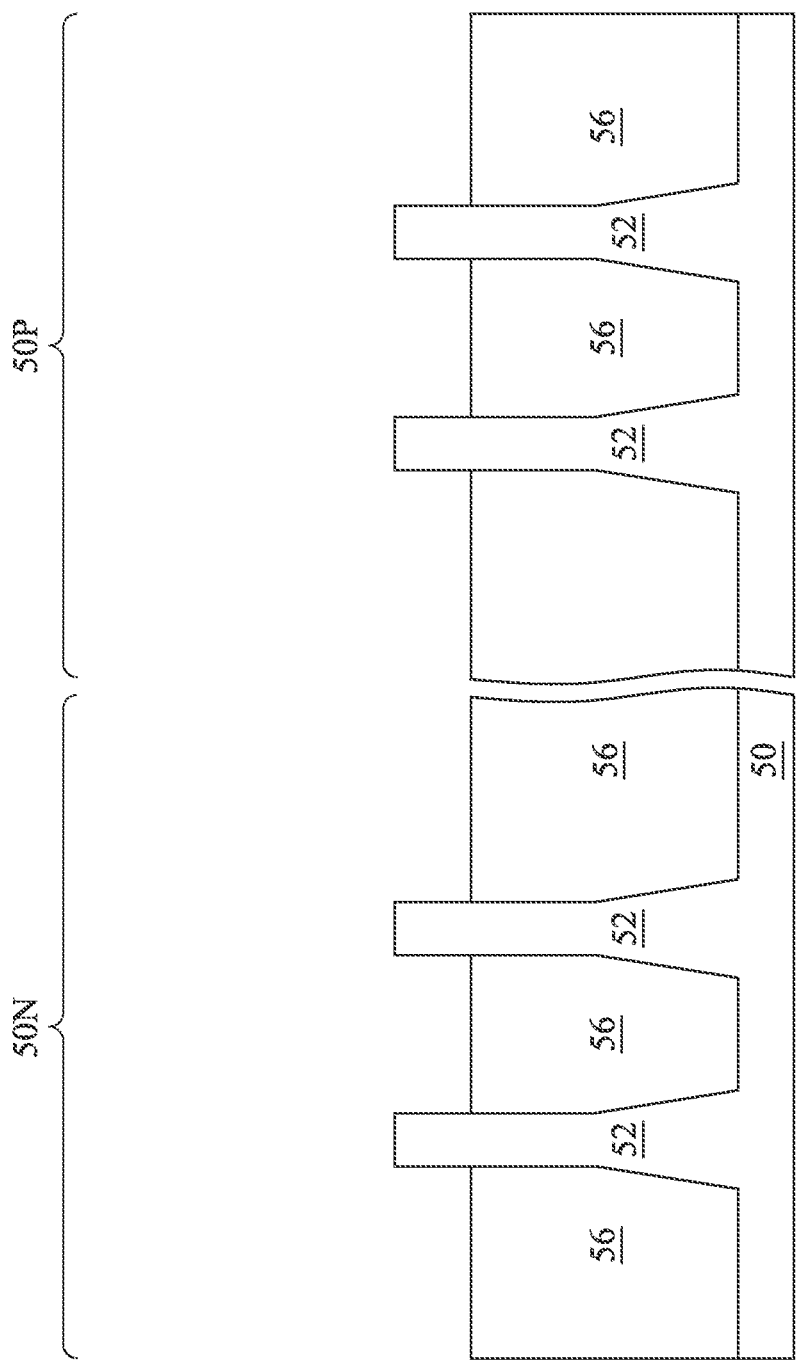

In FIG. 6, the insulation material 54 (see FIG. 5) is recessed to form shallow trench isolation (STI) regions 56. The insulation material 54 is recessed such that upper portions of fins 52 in the regions 50N and 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins. For example, the fins 52 in FIG. 5 can be recessed, and a material different from the fins 52 may be epitaxially grown over the recessed fins 52. In such embodiments, the fins comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in the region 50N different from a material in the region 50P. In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P. In the embodiments with different well types, the different implant steps for the region 50N and the region 50P may be achieved using a photoresist or other masks (not shown). For example, a first photoresist may be formed over the fins 52 and the STI regions 56 in both the region 50N and the region 50P. The first photoresist is patterned to expose the region 50P of the substrate 50. The first photoresist can be formed by using a spin-on technique and can be patterned using acceptable photolithography techniques. Once the first photoresist is patterned, an n-type impurity implantation is performed in the region 50P, while the remaining portion of the first photoresist acts as a mask to substantially prevent n-type impurities from being implanted into the region 50N. The n-type impurities may be phosphorus, arsenic, antimony, or the like, implanted in the region to a dose of equal to or less than $10^{15}$ cm$^{-2}$, such as between about $10^{12}$ cm$^{-2}$ and about $10^{15}$ cm$^{-2}$. In some embodiments, the n-type impurities may be implanted at an implantation energy of about 1 keV to about 10 keV. After the implantation, the first photoresist is removed, such as by an acceptable ashing process followed by a wet clean process.

Following the implantation of the region 50P, a second photoresist is formed over the fins 52 and the STI regions 56 in both the region 50P and the region 50N. The second photoresist is patterned to expose the region 50N of the substrate 50. The second photoresist can be formed by using a spin-on technique and can be patterned using acceptable photolithography techniques. Once the second photoresist is patterned, a p-type impurity implantation may be performed in the region 50N, while the remaining portion of the second photoresist acts as a mask to substantially prevent p-type impurities from being implanted into the region 50P. The p-type impurities may be boron, $BF_2$, indium, or the like, implanted in the region to a dose of equal to or less than $10^{15}$ cm$^{-2}$, such as between about $10^{12}$ cm$^{-2}$ and about $10^{15}$ cm$^{-2}$. In some embodiments, the p-type impurities may be implanted at an implantation energy of about 1 keV to about 10 keV. After the implantation, the second photoresist may be removed, such as by an acceptable ashing process followed by a wet clean process.

After performing the implantations of the region 50N and the region 50P, an anneal may be performed to activate the p-type and/or n-type impurities that were implanted. In some embodiments, the grown materials of epitaxial fins may be in situ doped during growth, which may obviate the implantations, although in situ doping and implantation doping may be used together.

Figure 7:
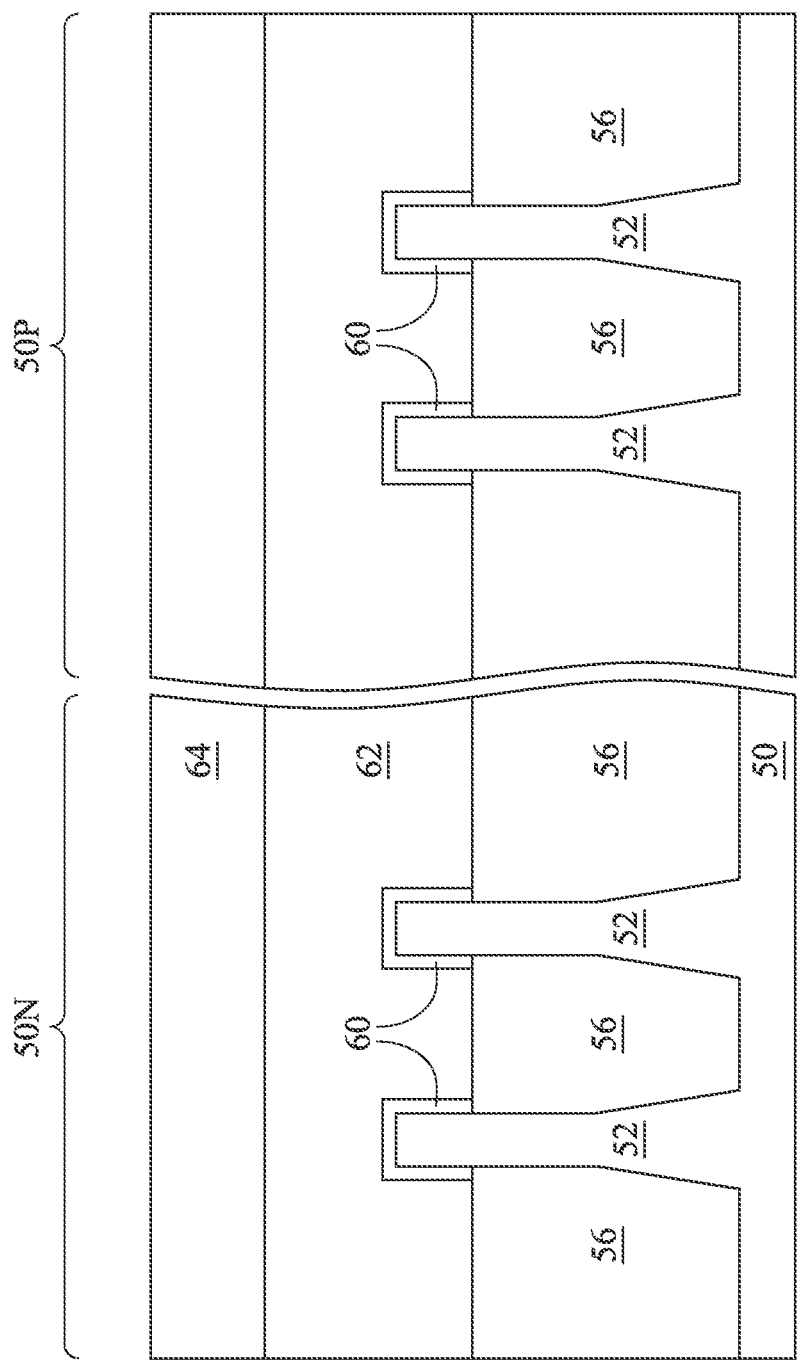

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized using, for example, a CMP process. The mask layer 64 may be deposited over the dummy gate layer 62. The dummy gate layer 62 may be a conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity than materials of the STI regions 56. The mask layer 64 may include, for example, one or more layers of silicon oxide, SiN, SiON, a combination thereof, or the like. In some embodiments, the mask layer 64 may comprise a layer of silicon nitride and a layer of silicon oxide over the layer of silicon nitride. In some embodiments, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A, 8B, 9A, 9B, 10A, 10B, 10C, 11A, 11B, 11C, 12A, 12B, 13A, 13B, 13C, 13D, 14A, 14B, 15A, 15B, 16A, 16B, 17A, 17B, 17C, 18A, 18B, 19A, 19B, 20A, 20B, and 20C illustrate various additional steps in the manufacturing of a FinFET device in accordance with some embodiments. FIGS. 8A, 8B, 9A, 9B, 10A, 10B, 10C, 11A, 11B, 11C, 12A, 12B, 13A, 13B, 13C, 13D, 14A, 14B, 15A, 15B, 16A, 16B, 17A, 17B, 17C, 18A, 18B, 19A, 19B, 20A, 20B, and 20C illustrate features in either of the region 50N and the region 50P. For example, the structures illustrated in FIGS. 8A, 8B, 9A, 9B, 10A, 10B, 10C, 11A, 11B, 11C, 12A, 12B, 13A, 13B, 13C, 13D, 14A, 14B, 15A, 15B, 16A, 16B, 17A, 17B, 17C, 18A, 18B, 19A, 19B, 20A, 20B, and 20C may be applicable to both the region 50N and the region 50P. Differences (if any) in the structures of the region 50N and the region 50P are described in the text accompanying each figure.

Figure 8B:
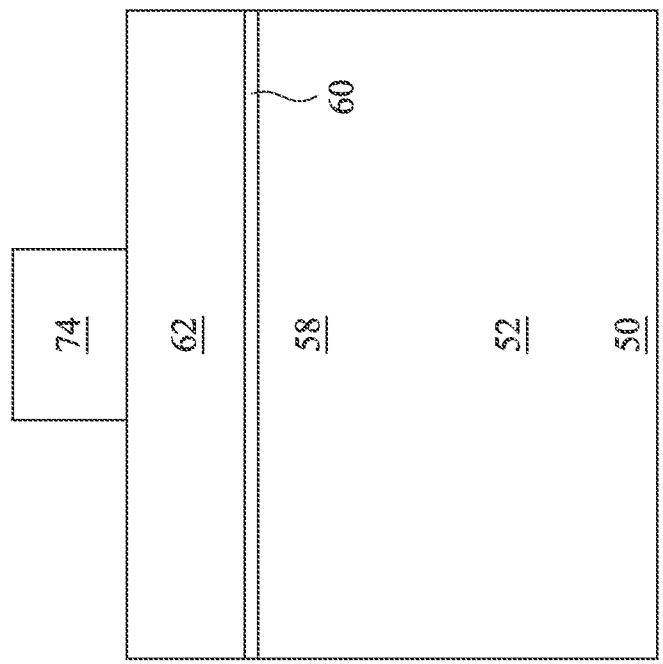
Figure 8A:
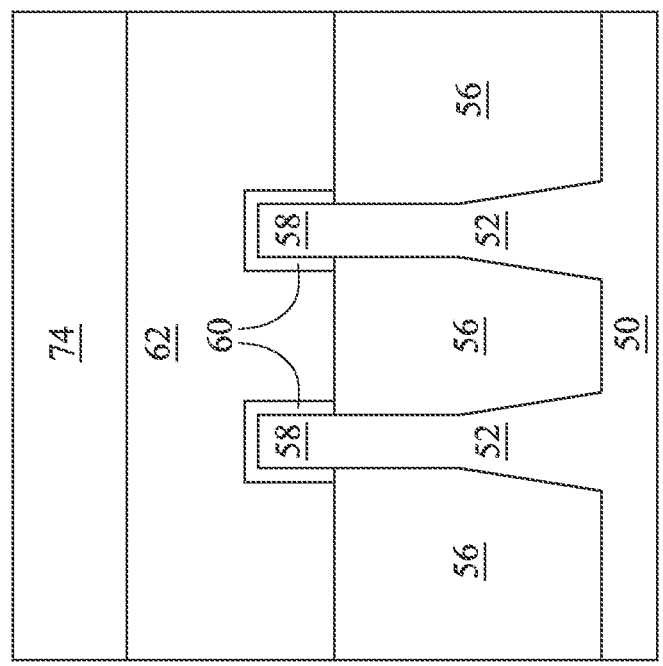

In FIGS. 8A and 8B, the mask layer 64 (see FIG. 7) may be patterned using acceptable photolithography and etching techniques to form masks 74. In some embodiments, the etching techniques may include one or more anisotropic etch processes such as a reactive ion etch (RIE), neutral beam etch (NBE), a combination thereof, or the like. In some embodiments, the patterning process comprises a dry etch process performed with an etchant mixture comprising a Br-containing gas, a Cl-containing gas, a N-containing gas, a F-containing gas, an O-containing gas, a combination thereof, or the like. In some embodiments, contents of the etchant mixture may be varied to increase a ratio of an etch rate of the mask layer 64 to an etch rate of the dummy gate layer 62. In some embodiments, the dry etch process is performed for a time between about 50 sec to about 240 sec.

Figure 9B:
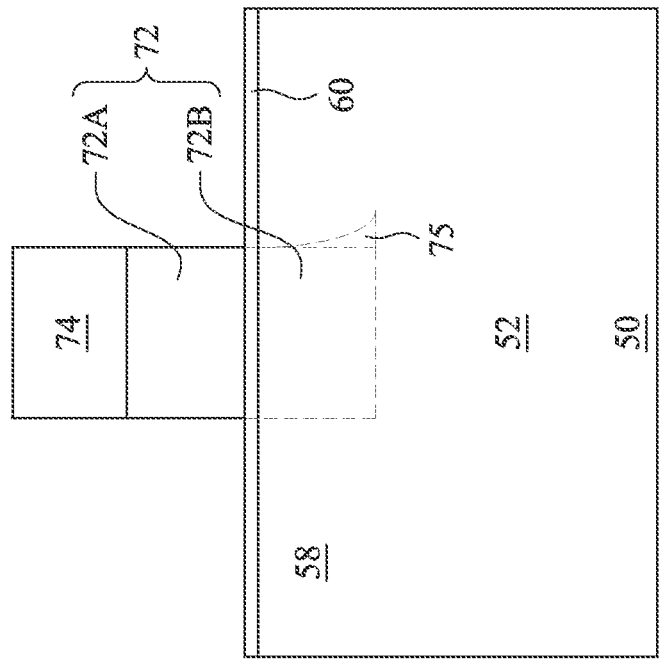
Figure 9A:
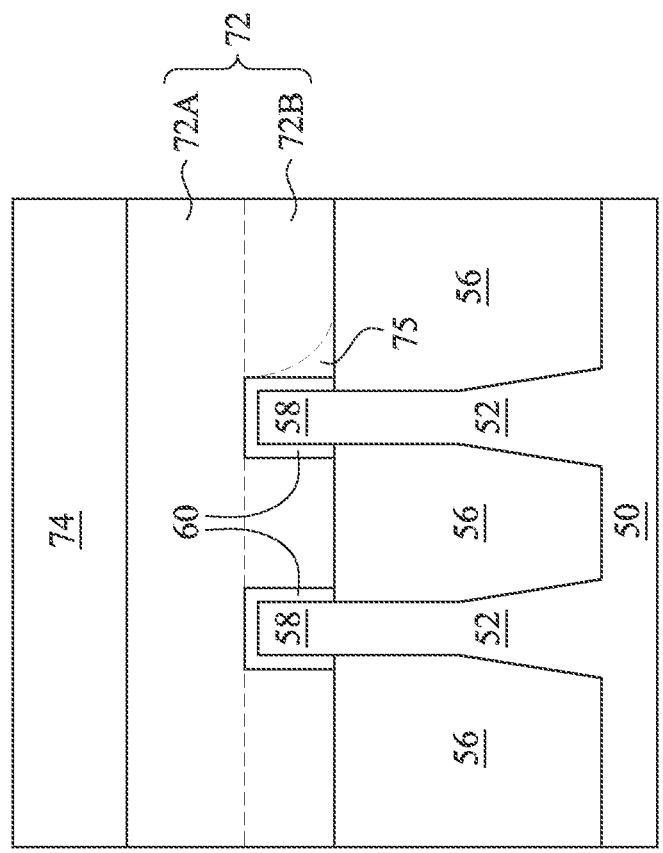

In FIGS. 9A and 9B, the pattern of the masks 74 is transferred to the dummy gate layer 62 (see FIGS. 8A and 8B) to form dummy gates 72. In some embodiments (not illustrated), the pattern of the masks 74 may also be transferred to the dummy dielectric layer 60 by an acceptable etching technique. The acceptable etching technique may include one or more anisotropic etch processes such as a reactive ion etch (RIE), neutral beam etch (NBE), a combination thereof, or the like. The etch process may be anisotropic. In some embodiments, the patterning process comprises a dry etch process performed with an etchant mixture comprising a Br-containing gas, a Cl-containing gas, a N-containing gas, a F-containing gas, an O-containing gas, a combination thereof, or the like. In some embodiments, the dry etch process is performed for a time between about 400 sec to about 1200 sec. In some embodiments, contents of the etchant mixture for etching the dummy gate layer 62 is different from contents of the etchant mixture for etching the mask layer 64 (see FIG. 7).

In some embodiments, the dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective fins 52. Each of the dummy gates 72 comprises an upper portion 72A above top surfaces of respective fins 52 and a lower portion 72B below the top surfaces of the respective fins 52 and above the top surfaces of the isolation regions 56. The lower portion 72B of the dummy gate 72 is shown by dashed lines in FIG. 9B since the lower portion 72B is not visible in the illustrated cross-section. In some embodiments, a width of the upper portion 72A is substantially same as a width of the lower portion 72B. In some embodiments, the dummy gates 72 may have one or more planar sidewalls.

In some embodiments, the etch process for forming the dummy gates 72 may form one or more footing portion 75 at interfaces between the fins 52 and the respective dummy gates 72. In the illustrated embodiments, a single footing portion 75 is shown at one of the interfaces between the fin 52 and the dummy gate 72, as an example. In other embodiments, footing portions may be also formed at other interfaces between the fins 52 and the dummy gates 72. The footing portion 75 is shown by dashed lines in FIGS. 9A and 9B since the footing portion 75 is not visible in the illustrated cross-sections. In some embodiments, a first portion of the footing portion 75 extends along a sidewall of the fin 52 as illustrated in FIG. 9A and a second portion of the footing portion 75 extends along a sidewall of the lower portion 72B of the dummy gate 72 as illustrated in FIG. 9B.

Figure 10B:
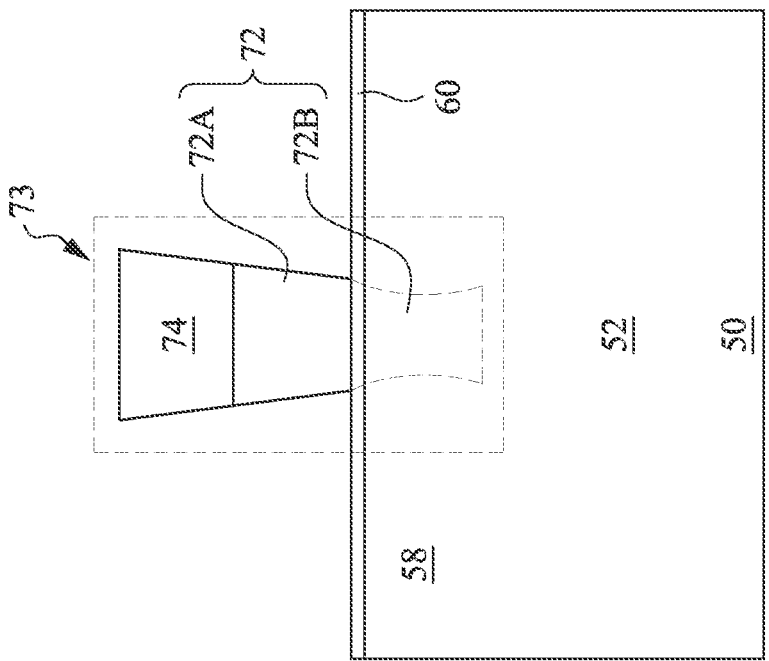
Figure 10A:
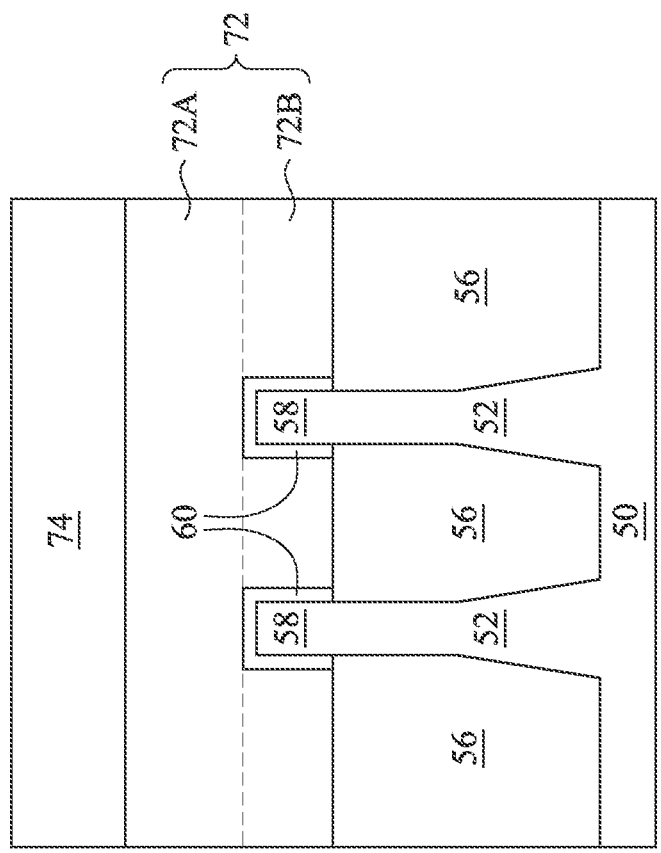
Figure 10C:
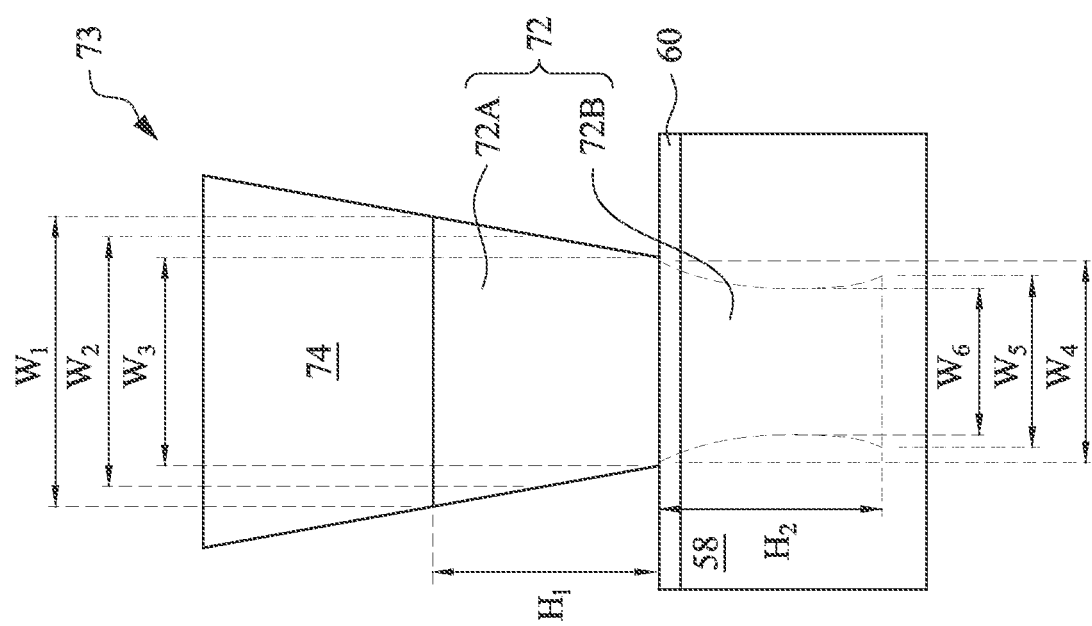

In FIGS. 10A and 10B, the dummy gates 72 are re-shaped. FIG. 10C illustrates a detailed view of region 73 of FIG. 10B. In some embodiments, the reshaping process comprises a plasma etching process performed using a plasma generated from a gas mixture comprising chlorine gas ($Cl_2$). In some embodiments, the gas mixture, in addition to the chlorine gas ($Cl_2$), may further comprise an additional gas such as $O_2$, $H_2$, Ar, $F_2$, $Br_2$, $N_2$, Xe, Kr, a combination thereof, or the like. In some embodiments, the plasma etching process is performed at a temperature between about 30° C. and about 150° C. In some embodiments, the plasma etching process is performed at a pressure between about $10^{-8}$ atm and about $10^{-3}$ atm. In some embodiments, the plasma etching process is performed for a time between about 20 sec and about 100 sec.

Referring to FIG. 10C, in some embodiments, the reshaping process alters the profile of the dummy gates 72 and removes the footing portions 75 (see FIGS. 9A and 9B) if present. After performing the reshaping process, the upper portion 72A of the dummy gate 72 has sloped sidewalls. The sidewalls of the upper portion 72A of the dummy gate 72 may be substantially planar. In some embodiments, the upper portion 72A of the dummy gate 72 has a height $H_1$ between about 50 nm and about 120 nm. In some embodiments, a topmost portion of the upper portion 72A of the dummy gate 72 has a width $W_1$, a middle portion of the upper portion 72A of the dummy gate 72 at a half height of the upper portion 72A of the dummy gate 72 has a width $W_2$, and a bottommost portion of the upper portion 72A of the dummy gate 72 has a width $W_3$. In some embodiments, the width $W_1$ is greater than or equal to the width $W_2$. In some embodiments, the width $W_1$ is greater than or equal to the width $W_3$. In some embodiments, the width $W_2$ is greater than or equal to the width $W_3$. In some embodiments, the width $W_1$ is greater than or equal to the width $W_2$, and the width $W_2$ is greater than or equal to the width $W_3$. In some embodiments, the width $W_1$ is between about 20 nm and about 35 nm. In some embodiments, the width $W_2$ is between about 20 nm and about 35 nm. In some embodiments, the width $W_3$ is between about 20 nm and about 35 nm.

In some embodiments, after performing the reshaping process, the lower portion 72B of the dummy gate 72 has curved sidewalls. In some embodiments, the lower portion 72B of the dummy gate 72 has concave sidewalls. In some embodiments, the lower portion 72B of the dummy gate 72 has a height $H_2$ between about 20 nm and about 40 nm. In some embodiments, a topmost portion of the lower portion 72B of the dummy gate 72 has a width $W_4$, a middle portion of the lower portion 72B of the dummy gate 72 at a half height of the lower portion 72B of the dummy gate 72 has a width $W_5$, and a bottommost portion of the lower portion 72B of the dummy gate 72 has a width $W_6$. In some embodiments, the width $W_3$ is greater than or equal to the width $W_4$. In some embodiments, the width $W_4$ is greater than the width $W_5$. In some embodiments, the width $W_4$ is greater than or equal to the width $W_6$. In some embodiments, the width $W_5$ is less than the width $W_6$. In some embodiments, the width $W_4$ is greater than the width $W_5$, the width $W_4$ is greater than or equal to the width $W_6$, and the width $W_5$ is less than the width $W_6$. In some embodiments, the width $W_4$ is between about 10 nm and about 29 nm. In some embodiments, the width $W_5$ is between about 10 nm and about 29 nm. In some embodiments, the width $W_6$ is between about 10 nm and about 29 nm.

Figure 11B:
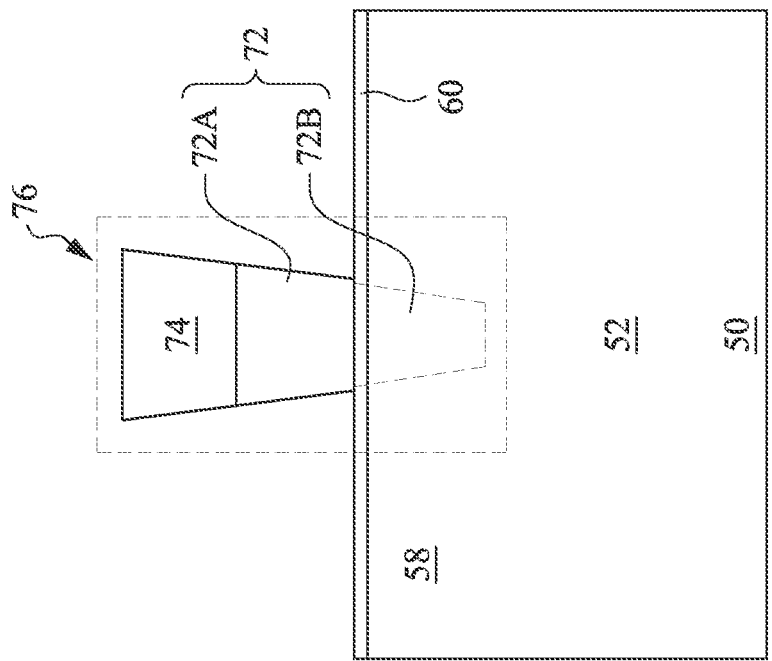
Figure 11A:
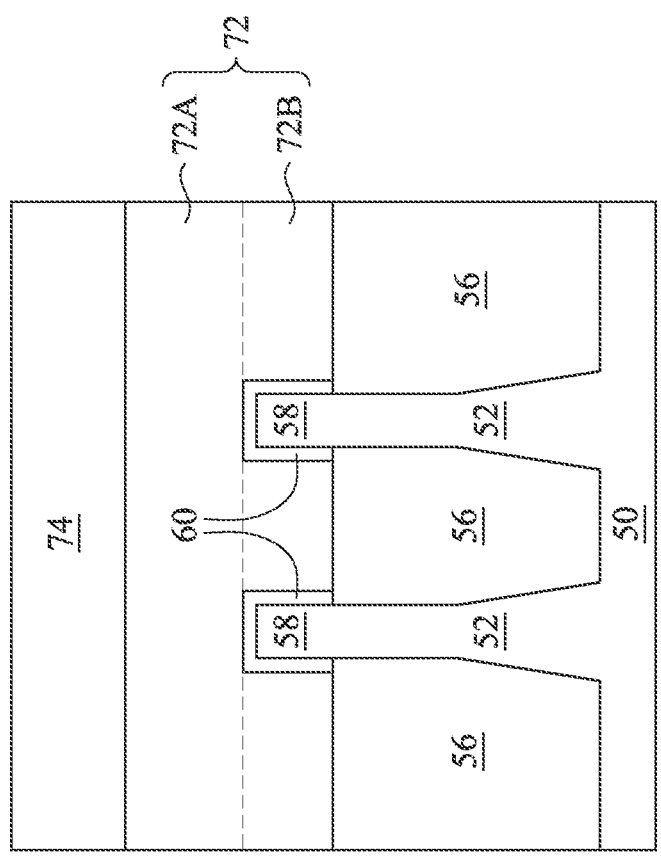
Figure 11C:
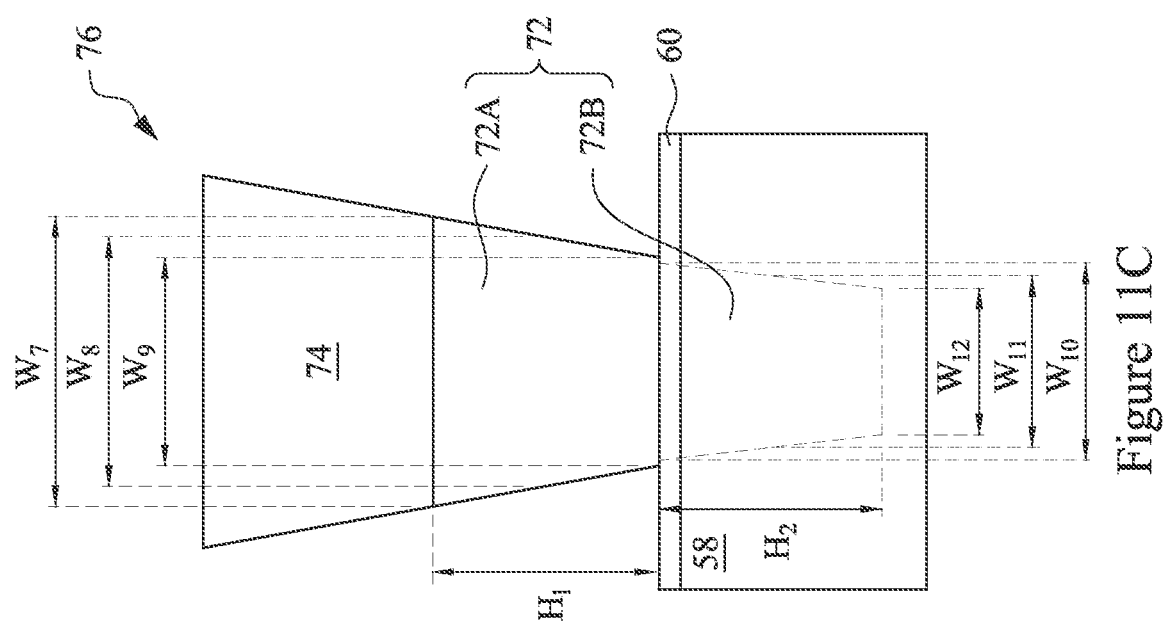

In FIGS. 11A and 11B, the dummy gates 72 are further reshaped in some embodiments. FIG. 11C illustrates a detailed view of region 76 of FIG. 11B. In some embodiments, the reshaping process described above with reference to FIGS. 10A, 10B, and 10C is further continued after forming the structure of FIGS. 10A, 10B, and 10C to further reshape the dummy gates 72. In some embodiments when the reshaping process comprises the plasma etching process described above with reference to FIGS. 10A, 10B, and 10C, the plasma etching process is performed for a total time between about 20 and about 100 second.

Referring to FIG. 11C, in some embodiments, after performing the reshaping process, the upper portion 72A of the dummy gate 72 has sloped sidewalls. The sidewalls of the upper portion 72A of the dummy gate 72 may be substantially planar. In some embodiments, a topmost portion of the upper portion 72A of the dummy gate 72 has a width $W_7$, a middle portion of the upper portion 72A of the dummy gate 72 at a half height of the upper portion 72A of the dummy gate 72 has a width $W_8$, and a bottommost portion of the upper portion 72A of the dummy gate 72 has a width $W_9$. In some embodiments, the width $W_7$ is greater than or equal to the width $W_8$. In some embodiments, the width $W_7$ is greater than or equal to the width $W_9$. In some embodiments, the width $W_8$ is greater than or equal to the width $W_9$. In some embodiments, the width $W_7$ is greater than or equal to the width $W_8$, and the width $W_8$ is greater than or equal to the width $W_9$. In some embodiments, the width $W_7$ is between about 28 nm and about 35 nm. In some embodiments, the width $W_8$ is between about 25 nm and about 30 nm. In some embodiments, the width $W_9$ is between about 20 nm and 28 nm.

In some embodiments, after performing the reshaping process, the lower portion 72B of the dummy gate 72 has sloped sidewalls. The sidewalls of the lower portion 72B of the dummy gate 72 may be substantially planar. In some embodiments, a topmost portion of the lower portion 72B of the dummy gate 72 has a width $W_{10}$, a middle portion of the lower portion 72B of the dummy gate 72 at a half height of the lower portion 72B of the dummy gate 72 has a width $W_{11}$, and a bottommost portion of the lower portion 72B of the dummy gate 72 has a width $W_{12}$. In some embodiments, the width $W_9$ is greater than or equal to the width $W_{10}$. In some embodiments, the width $W_{10}$ is greater than or equal to the width $W_{11}$. In some embodiments, the width $W_{11}$ is greater than or equal to the width $W_{12}$. In some embodiments, the width $W_{11}$ is greater than or equal to the width $W_{12}$. In some embodiments, the width $W_{10}$ is greater than or equal to the width $W_{11}$, and the width $W_{11}$ is greater than or equal to the width $W_{12}$. In some embodiments, the width $W_{10}$ is between about 20 nm and about 28 nm. In some embodiments, the width $W_{11}$ is between about 15 nm and about 23 nm. In some embodiments, the width $W_{12}$ is between about 10 nm and 18 nm.

Figure 12B:
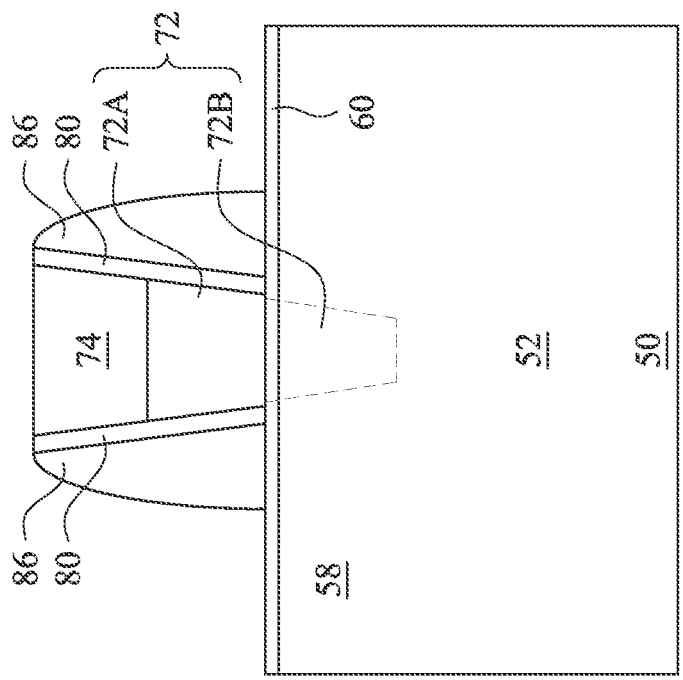
Figure 12A:
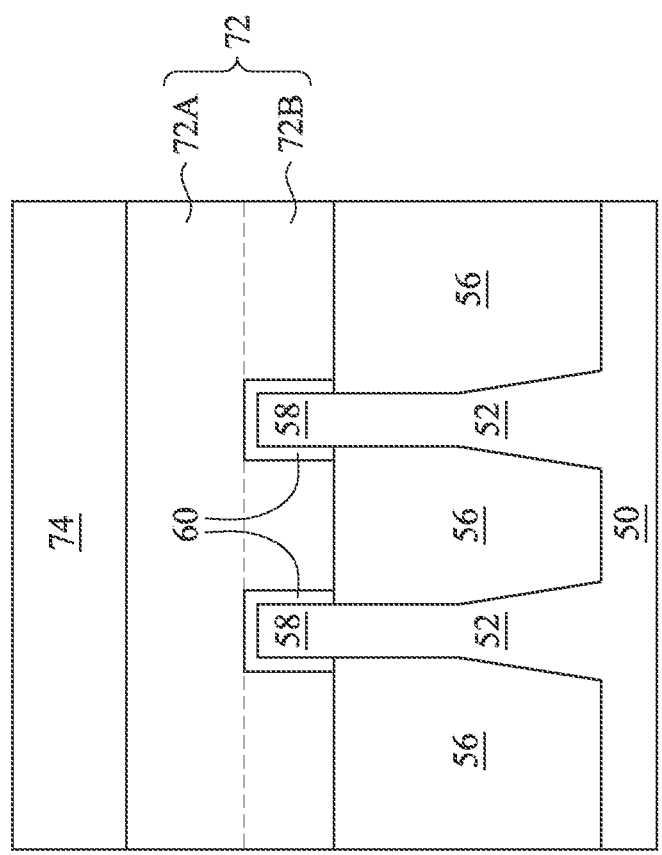

In FIGS. 12A and 12B, after forming the structure of FIGS. 11A, 11B, and 11C, gate seal spacers 80 may be formed on exposed surfaces of the dummy gates 72, the masks 74, and/or the fins 52. A thermal oxidation or a deposition followed by an anisotropic etch may form the gate seal spacers 80. The gate seal spacers 80 may comprise silicon oxide, silicon nitride, SiCN, SiOC, SiOCN, a combination thereof, or the like. After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P, while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a dose of impurities from about $10^{12}$ cm$^{-2}$ to about $10^{16}$ cm$^{-2}$. In some embodiments, the suitable impurities may be implanted at an implantation energy of about 1 keV to about 10 keV. An anneal may be used to activate the implanted impurities.

Further in FIGS. 12A and 12B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may comprise silicon oxide, silicon nitride, SiCN, SiOC, SiOCN, a combination thereof, or the like. In some embodiments, the gate spacers 86 may comprise a plurality of layers (not shown), such that the layers comprise different materials.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 13B:
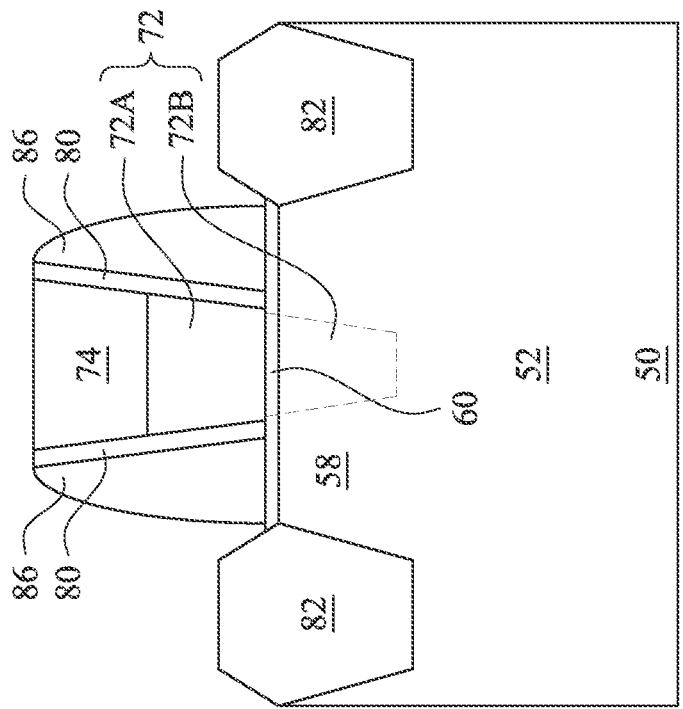
Figure 13A:
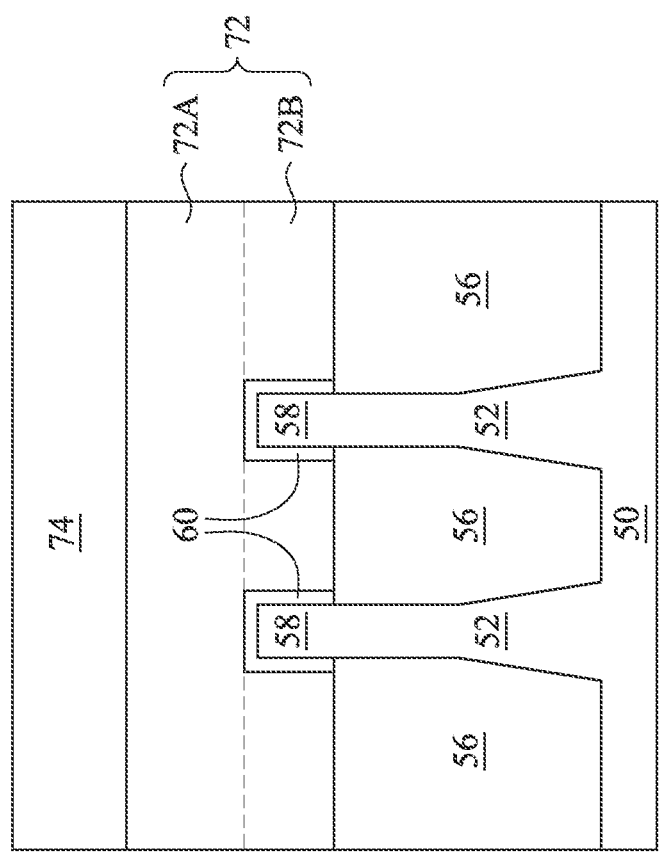
Figure 13D:
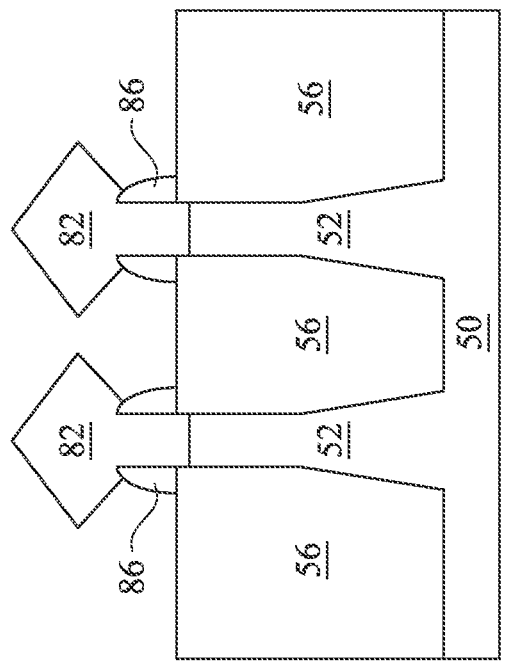
Figure 13C:
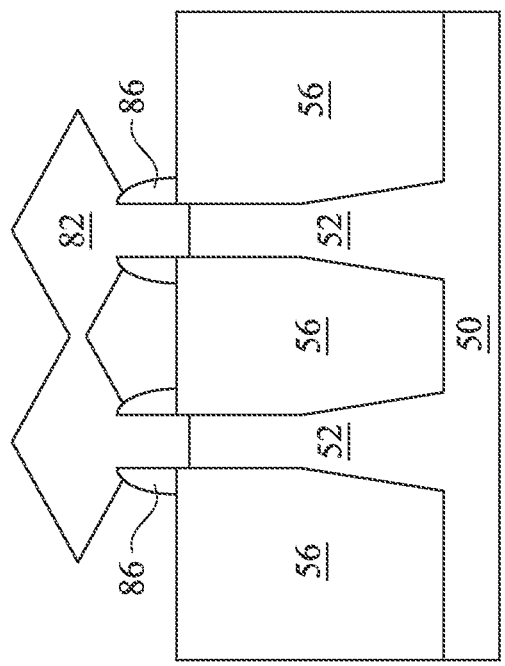

In FIGS. 13A and 13B, epitaxial source/drain regions 82 are formed in the fins 52 to exert stress in the respective channel regions 58, thereby improving device performance. The epitaxial source/drain regions 82 are formed in the fins 52 such that each dummy gate 72 is disposed between respective neighboring pairs of the epitaxial source/drain regions 82. In some embodiments, the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFET device.

The epitaxial source/drain regions 82 in the region 50N may be formed by masking the region 50P and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, a combination thereof, or the like. The epitaxial source/drain regions 82 in the region 50N may have surfaces raised from respective surfaces of the fins 52 and may have facets.

The epitaxial source/drain regions 82 in the region 50P may be formed by masking the region 50N and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, a combination thereof, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions 82 may have an impurity concentration of between about $10^{19}$ cm$^{-3}$ and about $10^{21}$ cm$^{-3}$. The n-type and/or p-type impurities for source/drain regions 82 may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent epitaxial source/drain regions 82 of a same FinFET to merge as illustrated by FIG. 13C. In other embodiments, adjacent epitaxial source/drain regions 82 remain separated after the epitaxy process is completed as illustrated by FIG. 13D. In the embodiments illustrated in FIGS. 13C and 13D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material from the sidewalls of the fins to allow the epitaxially grown region to extend to the surface of the STI region 56.

Figure 14B:
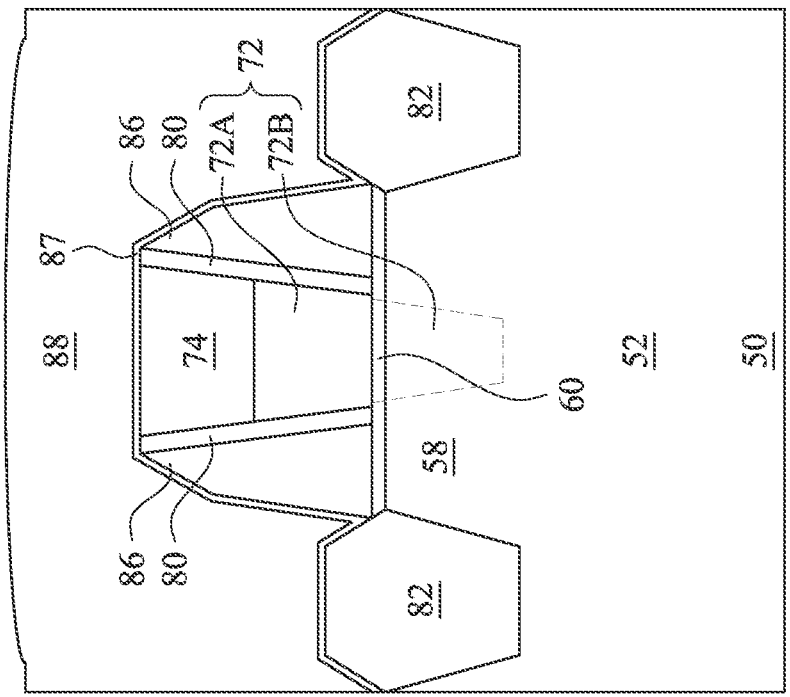
Figure 14A:
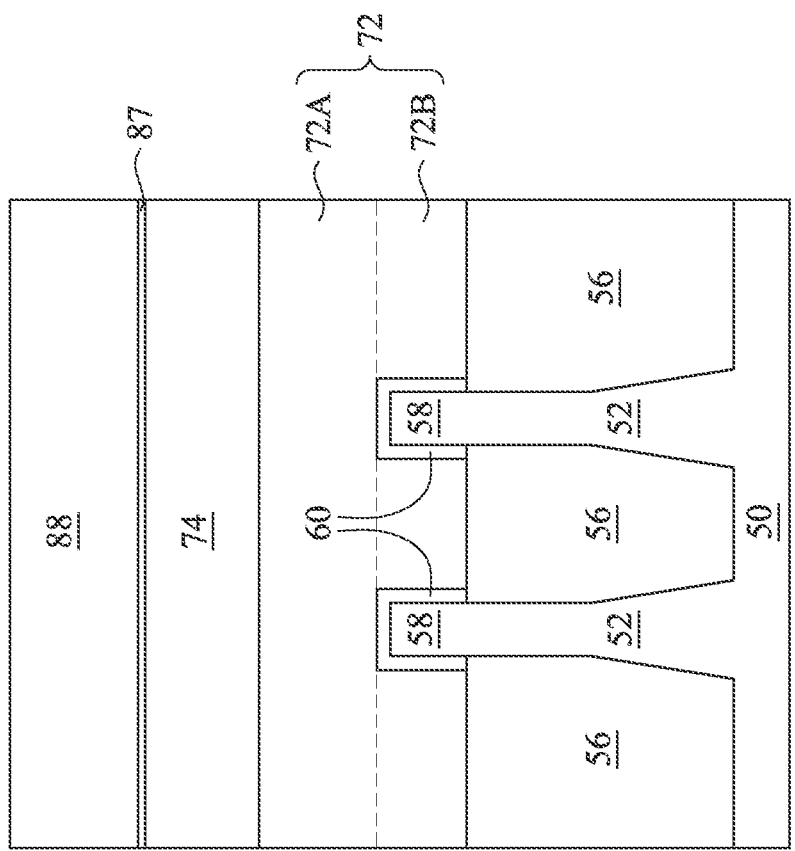

In FIGS. 14A and 14B, a first ILD 88 is deposited over the structure illustrated in FIGS. 13A and 13B. The first ILD 88 may be formed of a dielectric material, and may be deposited by any suitable method, such as CVD, plasma-enhanced CVD (PECVD), FCVD, a combination thereof, or the like. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be also used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, a combination thereof, or the like, having a different etch rate than the material of the overlying first ILD 88.

Figure 15B:
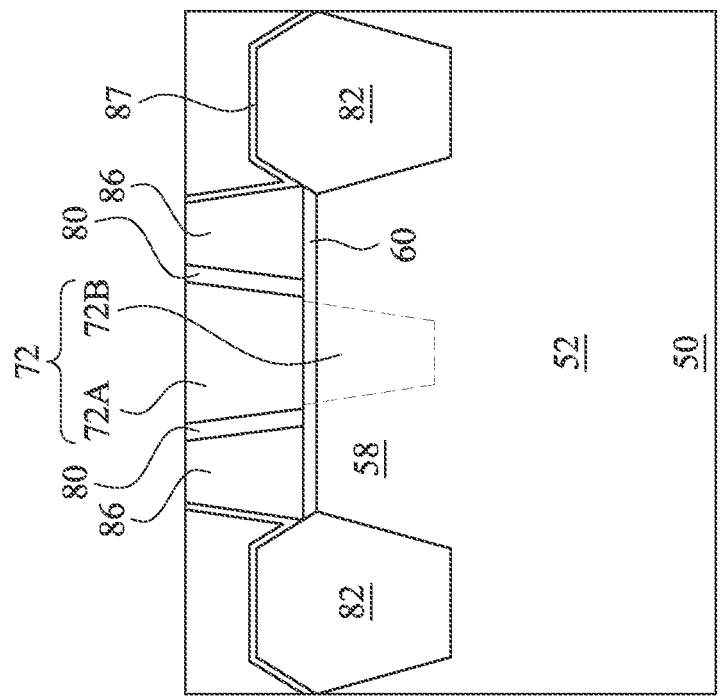
Figure 15A:
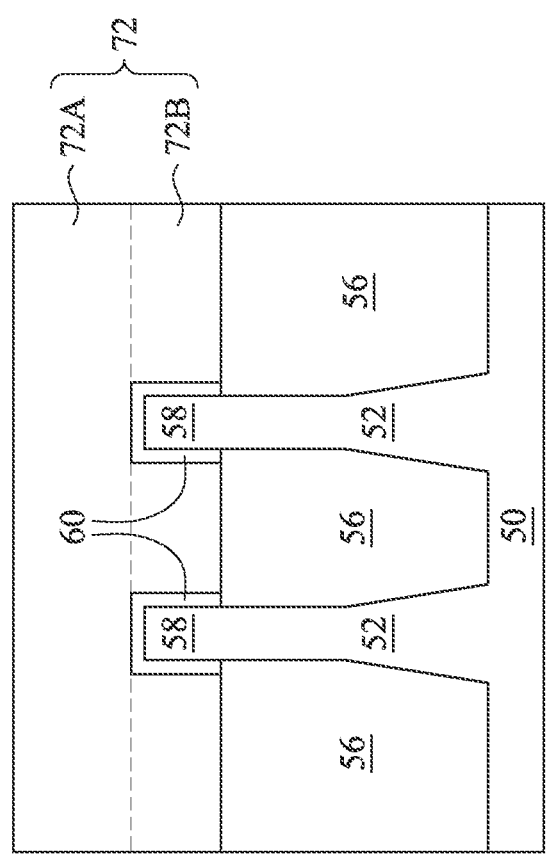

In FIGS. 15A and 15B, a planarization process, such as a CMP process, may be performed to level the top surface of the first ILD 88 with the top surfaces of the dummy gates 72 or the masks 74 (see FIGS. 14A and 14B). The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level with each other. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 16B:
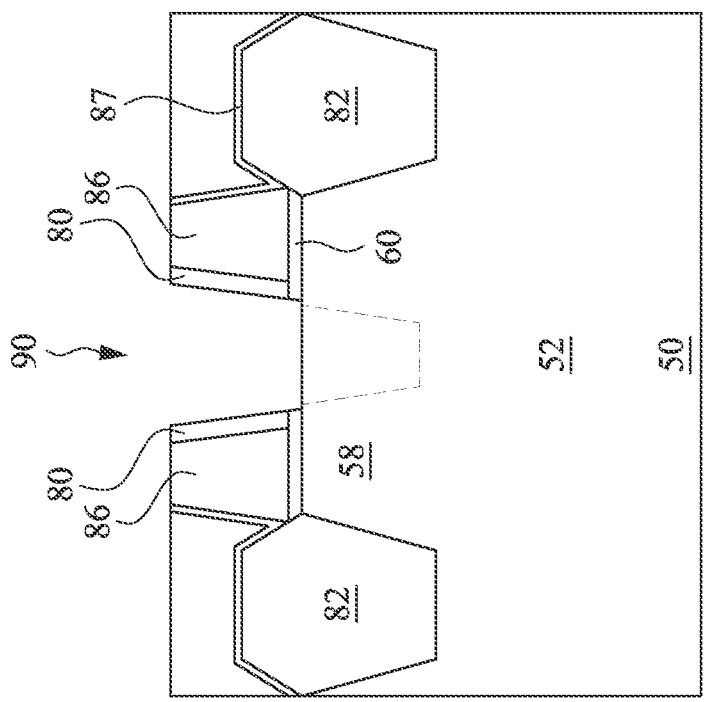
Figure 16A:
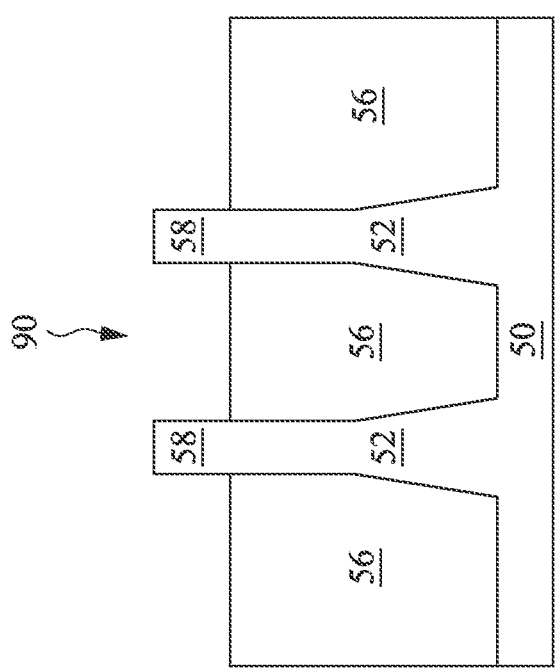

In FIGS. 16A and 16B, the dummy gates 72, and the masks 74, if present, are removed in an etching step(s), so that openings 90 are formed. Portions of the dummy dielectric layer 60 in the openings 90 may also be removed. In some embodiments, only the dummy gates 72 are removed and the dummy dielectric layer 60 remains and is exposed by the openings 90. In some embodiments, portions (illustrated by dashed lines in FIG. 16B) of the openings 90 extend below the top surfaces of the fins 52. In some embodiments, the dummy dielectric layer 60 is removed from the openings 90 in a first region of a die (e.g., a core logic region) and remains in openings 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each opening 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

As described below in greater detail, replacement gates are formed in the openings 90. Since the openings 90 are formed by removing the respective dummy gates 72, the openings 90 may have similar profiles as the dummy gates 72. In some embodiments, such profiles for the openings 90 improve gap filling characteristic of the openings 90 such as, for example, gap filling rates of various materials while forming the replacement gates in the openings 90. Furthermore, by removing the footing portions 75 (see FIGS. 9A and 9B) of the dummy gates 72 using the reshaping process as described above with reference to FIGS. 10A, 10B, and 10C, and/or FIGS. 11A, 11B, and 11C, the replacement gates are formed without having portions that would be formed in place of the footing portions 75. Accordingly, shorting between the replacement gates and subsequently formed adjacent source/drain contacts is avoided.

Figure 17B:
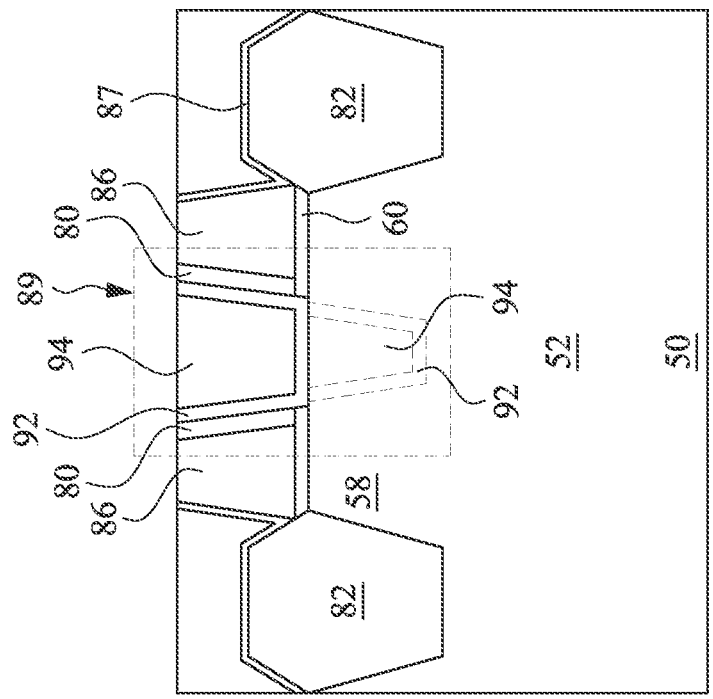
Figure 17A:
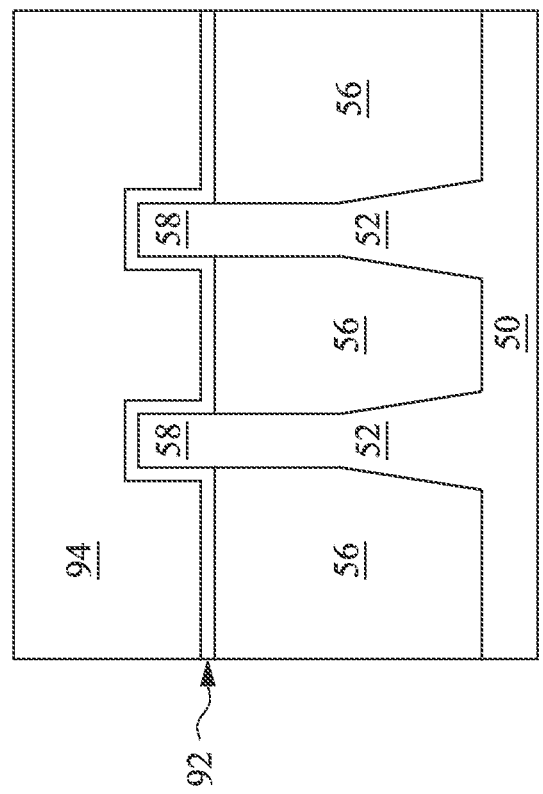
Figure 17C:
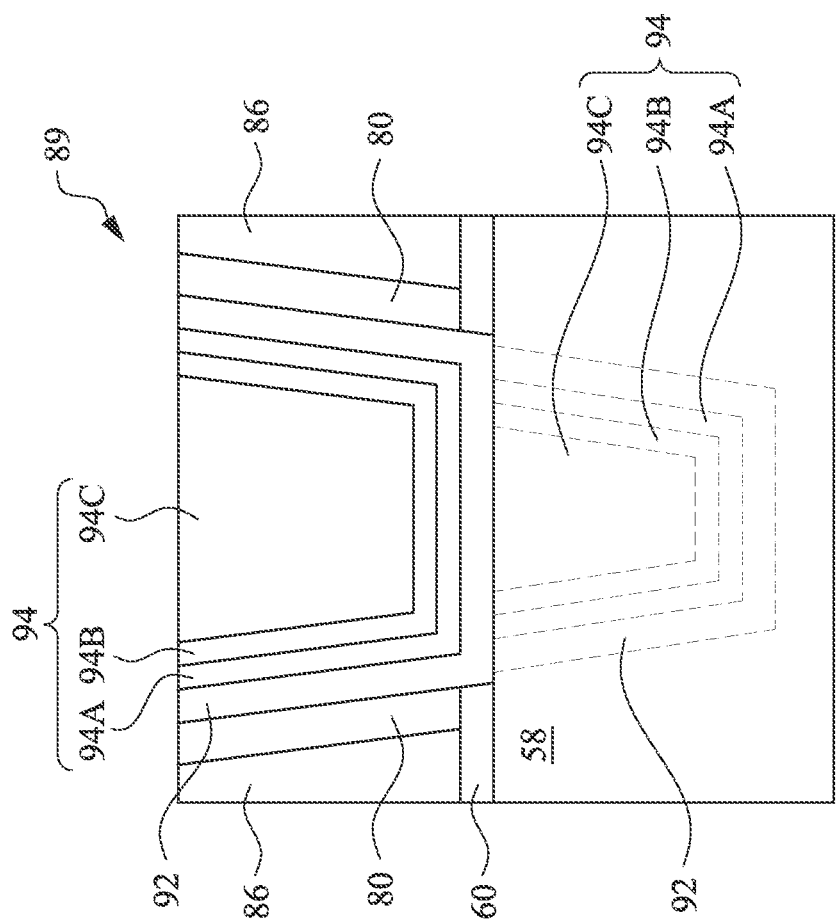

In FIGS. 17A and 17B, gate dielectric layers 92 and gate electrodes 94 are formed for replacement gates. FIG. 17C illustrates a detailed view of region 89 of FIG. 17B. Gate dielectric layers 92 are deposited conformally in the openings 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, a combination thereof, or the like. In embodiments where portions of the dummy dielectric layer 60 remains in the openings 90, the gate dielectric layers 92 include a material of the dummy gate dielectric layer 60 (e.g., silicon oxide).

The gate electrodes 94 are deposited over the gate dielectric layers 92 and fill the remaining portions of the openings 90. Although a single layer gate electrode 94 is illustrated in FIG. 17B, the gate electrode 94 may comprise any number of liner layers 94A, any number of work function tuning layers 94B, and a conductive fill layer 94C as illustrated by FIG. 17C. The liner layers 94A may include TiN, TiO, TaN, TaC, combinations thereof, multi-layers thereof, or the like, and may be formed using PVD, CVD, ALD, a combination thereof, or the like. In region 50N, the work function tuning layers 94B may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In region 50P, the work function tuning layers 94B may include TiN, WN, TaN, Ru, Co, combinations thereof, multi-layers thereof, or the like, and may be formed using PVD, CVD, ALD, a combination thereof, or the like. In some embodiments, the conductive fill layer 94C may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like.

After the filling of the openings 90, a planarization process, such as a CMP, may be performed to remove the excess portions of the gate dielectric layers 92 and the gate electrodes 94, which excess portions are over the top surface of the ILD 88. The remaining portions of the gate electrodes 94 and the gate dielectric layers 92 thus form replacement gates of the resulting FinFETs. The gate electrodes 94 and the gate dielectric layers 92 may be collectively referred to as a "gate stack." The gate stacks may extend along sidewalls of channel regions 58 of the fins 52 as illustrated by dashed lines in FIGS. 17B and 17C. In some embodiments, the gate stack 92/94 (including gate dielectric layer 92 and a corresponding overlying gate electrode 94) may have a similar profile as the dummy gate 72 illustrated in FIGS. 11A, 11B, and 11C, and the description is not repeated herein.

The formation of the gate dielectric layers 92 in the region 50N and the region 50P may occur simultaneously such that the gate dielectric layers 92 in each region are formed of the same materials. In other embodiments, the gate dielectric layers 92 in each region may be formed by distinct processes such that the gate dielectric layers 92 in different regions may be formed of different materials. The formation of the conductive fill layers 94C in the region 50N and the region 50P may occur simultaneously such that the conductive fill layers 94C in each region are formed of the same materials. In other embodiments, the conductive fill layers 94C in each region may be formed by distinct processes such that the conductive fill layers 94C in different regions may be formed of different materials. Various masking steps may be used to mask and expose appropriate regions when using distinct processes.

Figure 18A:
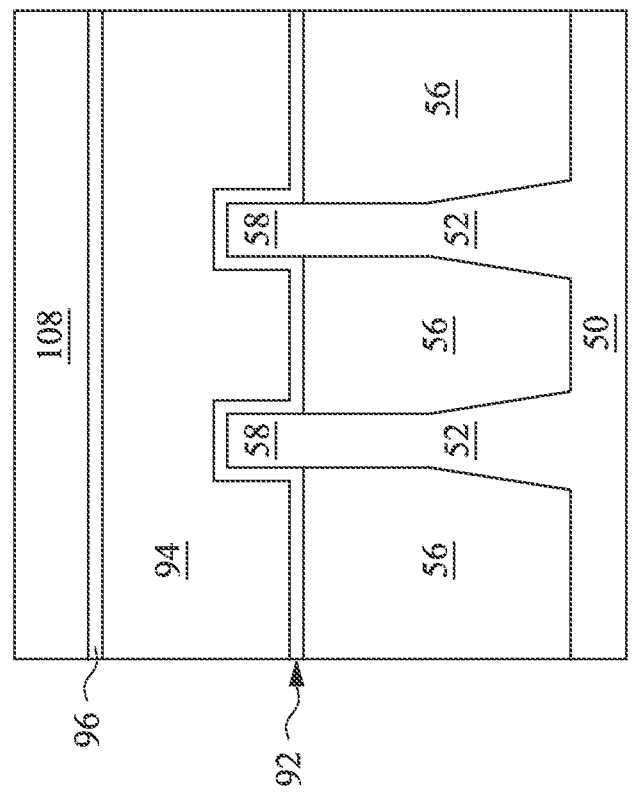
Figure 18B:
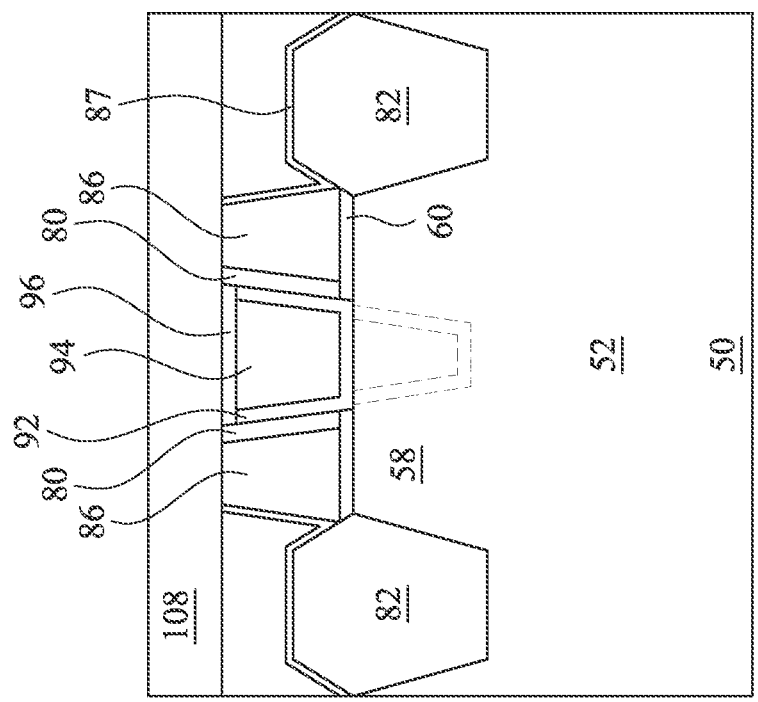

In FIGS. 18A and 18B, after performing the planarization process, a second ILD 108 is deposited over the first ILD 88 and the gate stacks 92/94 (including gate dielectric layers 92 and corresponding overlying gate electrodes 94). In some embodiment, the second ILD 108 is a flowable film formed by a flowable CVD method. In some embodiments, the second ILD 108 is formed of a dielectric material such as PSG, BSG, BPSG, USG, a combination thereof, or the like, and may be deposited by any suitable method, such as CVD, PECVD, a combination thereof, or the like. In some embodiments, the first ILD 88 and the second ILD 108 comprise a same material. In other embodiments, the first ILD 88 and the second ILD 108 comprise different materials.

In some embodiments, before the formation of the second ILD 108, the gate stacks 92/94 are recessed, so that recesses are formed directly over the gate stacks 92/94 and between opposing portions of gate spacers 86. Gate masks 96 comprising one or more layers of a dielectric material, such as silicon nitride, silicon oxynitride, a combination thereof, or the like, are filled in the recesses, followed by a planarization process to remove excess portions of the dielectric material extending over the first ILD 88. The subsequently formed gate contacts 110 (see FIGS. 19A and 19B) penetrate through the respective gate mask 96 to contact the top surface of the respective recessed gate electrode 94.

Figure 19B:
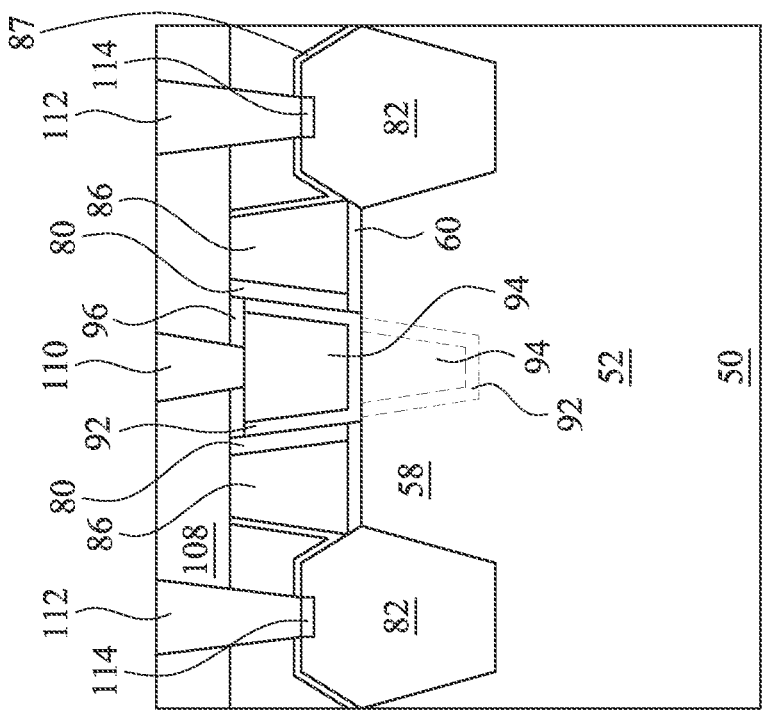
Figure 19A:
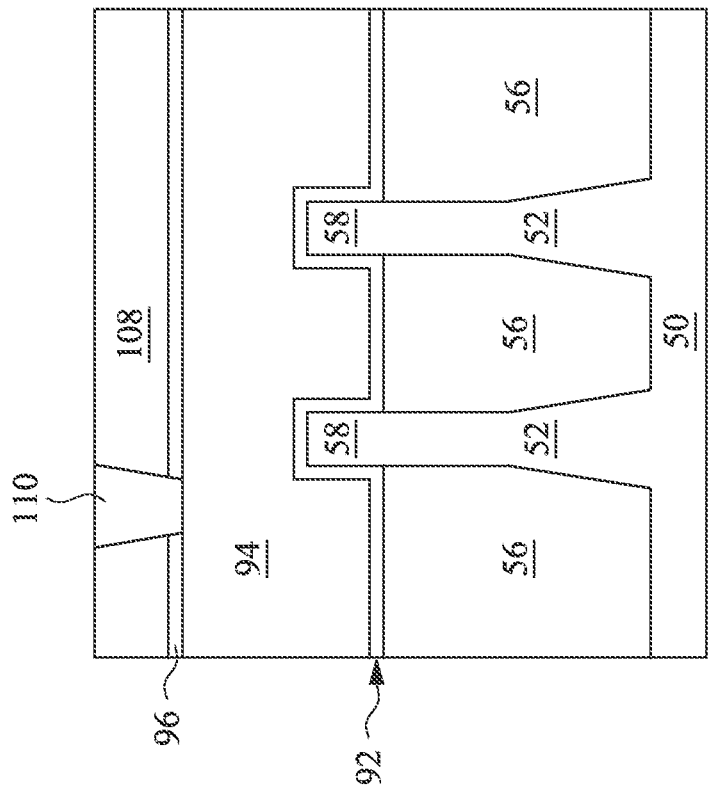

In FIGS. 19A and 19B, gate contacts 110 and source/drain contacts 112 are formed through the second ILD 108 and the first ILD 88 in accordance with some embodiments. Openings for the source/drain contacts 112 are formed through the first ILD 88 and the second ILD 108, and openings for the gate contacts 110 are formed through the second ILD 108 and the gate masks 96. The openings may be formed using acceptable photolithography and etching techniques. After forming the openings for the source/drain contacts 112, silicide layers 114 are formed through the openings for the source/drain contacts 112. In some embodiments, a metallic material is deposited in the openings for the source/drain contacts 112. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, an annealing process is performed to form the silicide layers 114. In some embodiments where the epitaxial source/drain regions 82 comprise silicon, the annealing process causes the metallic material to react with silicon to form a silicide of the metallic material at interfaces between the metallic material and the epitaxial source/drain regions 82. After forming the silicide layers 114, unreacted portions of the metallic material are removed using a suitable removal process.

Subsequently, a liner, such as a diffusion barrier layer, an adhesion layer, or the like, and a conductive material are formed in the openings for the source/drain contacts 112 and in the openings for the gate contacts 110. The liner may include titanium, titanium nitride, tantalum, tantalum nitride, a combination thereof, or the like. The conductive material may include copper, a copper alloy, silver, gold, tungsten, cobalt, aluminum, nickel, a combination thereof, or the like. A planarization process, such as a CMP process, may be performed to remove excess material from a surface of the second ILD 108. The remaining portions of the liner and the conductive material form the source/drain contacts 112 and the gate contacts 110 in the openings. The source/drain contacts 112 are physically and electrically coupled to the respective epitaxial source/drain regions 82, and the gate contacts 110 are physically and electrically coupled to the respective gate electrodes 94. The source/drain contacts 112 and gate contacts 110 may be formed in different processes, or may be formed in the same process. Although shown as being formed in the same cross-sections, it should be appreciated that each of the source/drain contacts 112 and the gate contacts 110 may be formed in different cross-sections, which may avoid shorting of the contacts.

Figure 20B:
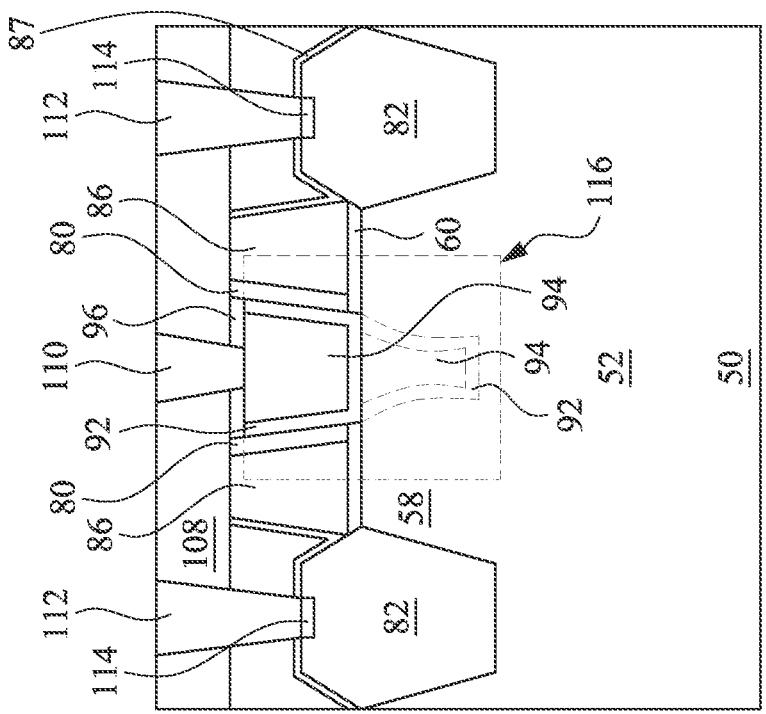
Figure 20A:
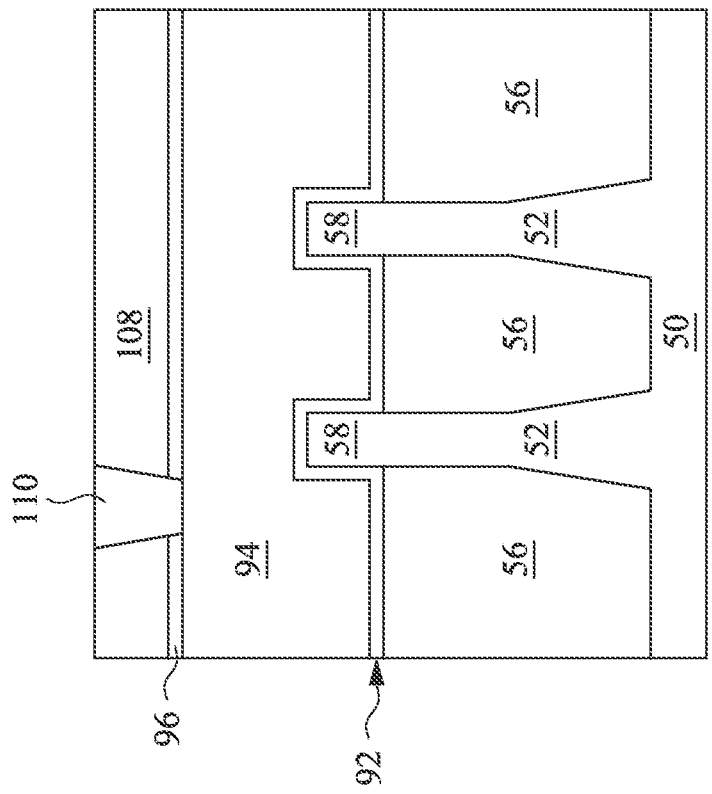
Figure 20C:
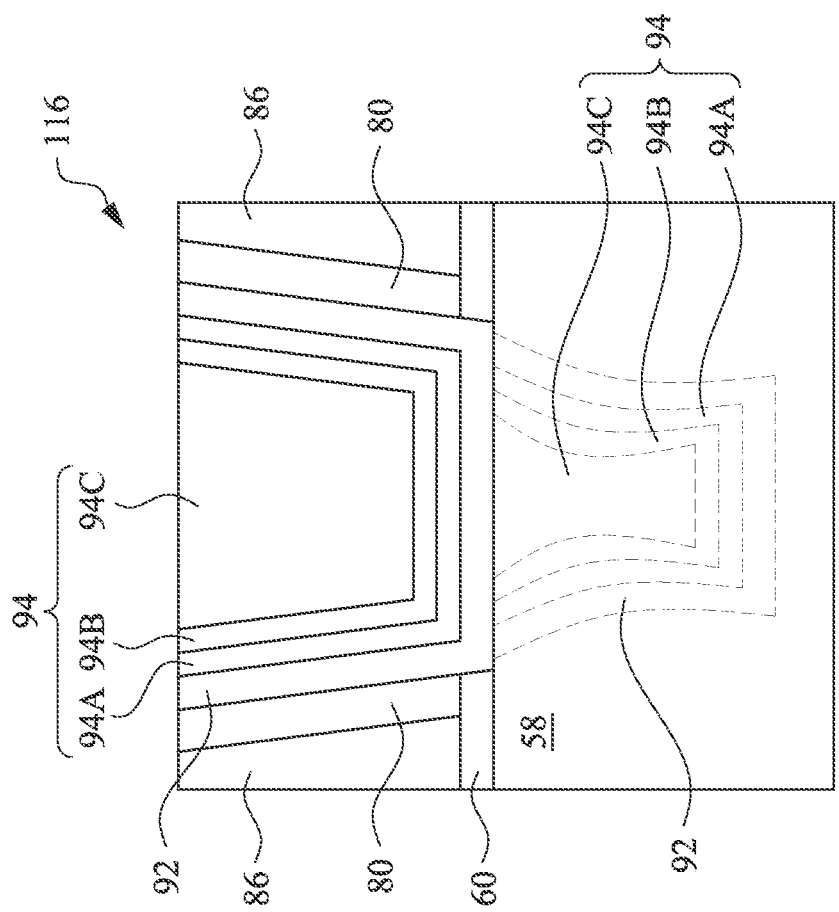

Referring further to FIGS. 19A, 19B, and 19C, the illustrated structure is formed by performing the process steps described above with reference to FIGS. 12A, 12B, 13A, 13B, 13C, 13D, 14A, 14B, 15A, 15B, 16A, 16B, 17A, 17B, 17C, 18A, 18B, 19A, and 19B on the structure illustrated in FIGS. 11A, 11B, and 11C. In other embodiments, the process steps described above with reference to Figures may be 12A, 12B, 13A, 13B, 13C, 13D, 14A, 14B, 15A, 15B, 16A, 16B, 17A, 17B, 17C, 18A, 18B, 19A, and 19B may be performed on the structure illustrated in FIGS. 10A, 10B, and 10C to form a structure illustrated in FIGS. 20A, 20B, and 20C, with FIG. 20C illustrating a detailed view of a region 116 of FIG. 20B. The structure illustrated in FIGS. 20A, 20B, and 20C is similar to the structure illustrated in FIGS. 19A, 19B, and 19C, with similar features being labeled with similar numerical references and the description of these similar features are not repeated herein. In some embodiments, the gate stack 92/94 (including gate dielectric layer 92 and a corresponding overlying gate electrode 94) may have a similar profile as the dummy gate 72 illustrated in FIGS. 10A, 10B, and 10C, and the description is not repeated herein.

Figure 21:
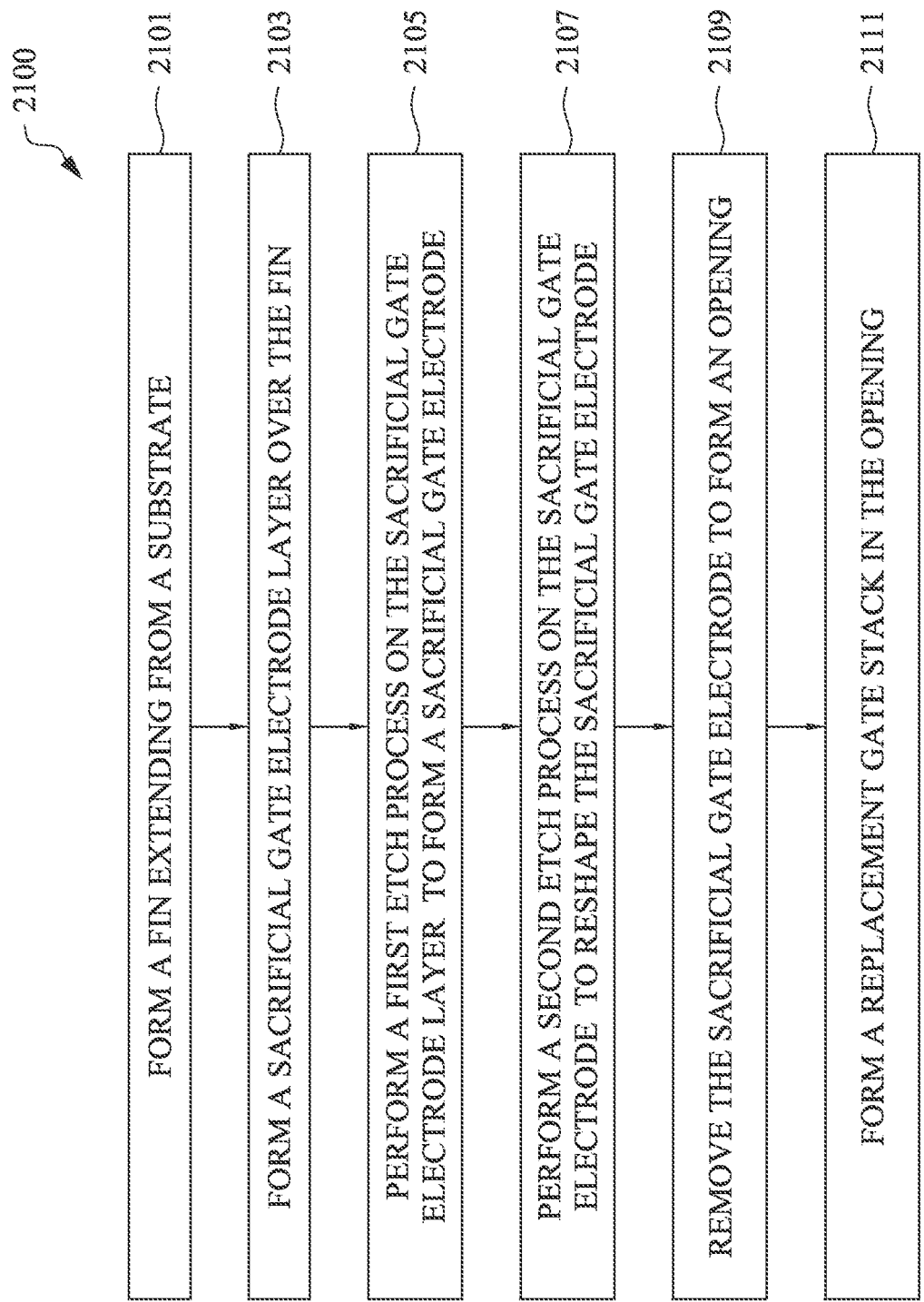
FIG. 21 is a flow diagram illustrating a method of forming a gate structure in accordance with some embodiments.

FIG. 21 is a flow diagram illustrating a method 2100 of forming a gate structure in accordance with some embodiments. The method 2100 starts with step 2101, where a fin (such as the fin 52 illustrated in FIG. 3) is formed extending from a substrate (such as the substrate 50 illustrated in FIG. 3) as described above with reference to FIG. 3. In step 2103, a sacrificial gate electrode layer (such as the sacrificial gate layer 62 illustrated in FIG. 7) is formed over the fin as described above with reference to FIG. 7. In step 2105, a first etch process is performed on the sacrificial gate electrode layer to form a sacrificial gate electrode (such as the dummy gate 72 illustrated in FIGS. 9A and 9B) as described above with reference to FIGS. 9A and 9B. In step 2107, a second etch process is performed on the sacrificial gate electrode to reshape the sacrificial gate electrode as described above with reference to FIGS. 10A, 10B, and 10C and/or FIGS. 11A, 11B, and 11C. In step 2109, the sacrificial gate electrode is removed to form an opening (such as the opening 90 illustrated in FIGS. 16A and 16B) as described above with reference to FIGS. 16A and 16B. In step 2111, a replacement gate stack (such as the gate stack comprising the gate dielectric layer 92 and the gate electrode 94 illustrated in FIGS. 17A, 17B, and 17C) is formed in the opening as described above with reference to FIGS. 17A, 17B, and 17C.

In an embodiment, a method includes forming a fin extending from a substrate. A sacrificial gate electrode layer is formed along a sidewall and a top surface of the fin. A patterning process is performed on the sacrificial gate electrode layer to form a sacrificial gate electrode. A reshaping process is performed on the sacrificial gate electrode to form a reshaped sacrificial gate electrode. The reshaped sacrificial gate electrode includes a first portion along the top surface of the fin and a second portion along the sidewall of the fin. A width of the first portion decreases as the first portion extends from a top surface of the first portion toward the top surface of the fin. A width of the second portion decreases as the second portion extends from the top surface of the fin toward the substrate. In an embodiment, performing the patterning process on the sacrificial gate electrode layer includes performing a first etch process on the sacrificial gate electrode layer, performing the reshaping process on the sacrificial gate electrode includes performing a second etch process on the sacrificial gate electrode, and the second etch process is different from the first etch process. In an embodiment, the second etch process comprises a plasma etch process. In an embodiment, the first portion of the reshaped sacrificial gate electrode has a sloped sidewall. In an embodiment, the second portion of the reshaped sacrificial gate electrode has a sloped sidewall. In an embodiment, the second portion of the reshaped sacrificial gate electrode has a curved sidewall. In an embodiment, the curved sidewall is a concave sidewall. In an embodiment, the method further includes removing the reshaped sacrificial gate electrode to form an opening; and forming a replacement gate stack in the opening.

In another embodiment, a method includes forming a fin extending from a substrate. An isolation region is formed over the substrate and adjacent the fin. The fin extends above a top surface of the isolation region. A sacrificial gate electrode layer is deposited along a sidewall and a top surface of the fin and along a top surface of the isolation region. A first etch process is performed on the sacrificial gate electrode layer to form a sacrificial gate electrode. A second etch process is performed on the sacrificial gate electrode to form a reshaped sacrificial gate electrode. The second etch process is different from the first etch process. The reshaped sacrificial gate electrode includes a first portion along the top surface of the fin and a second portion along the sidewall of the fin. A first width of the first portion at a top surface of the first portion is greater than a second width of the first portion at the top surface of the fin. A third width of the second portion at the top surface of the fin is greater than a fourth width of the second portion at the top surface of the isolation region. In an embodiment, the second etch process is a plasma etch process. In an embodiment, the second width is greater than the third width. In an embodiment, the second width is equal to the third width. In an embodiment, the method further includes etching the reshaped sacrificial gate electrode to form an opening, and depositing a conductive material in the opening to form a replacement gate stack. In an embodiment, the first portion of the reshaped sacrificial gate electrode has a first sloped sidewall, and the second portion of the reshaped sacrificial gate electrode has a second sloped sidewall. In an embodiment, the first portion of the reshaped sacrificial gate electrode has a sloped sidewall, and the second portion of the reshaped sacrificial gate electrode has a curved sidewall.

In yet another embodiment, a semiconductor device includes a fin extending from a substrate and a gate stack along a sidewall and a top surface of the fin. The gate stack includes a first portion along the top surface of the fin and a second portion along the sidewall of the fin. A width of the first portion decreases as the first portion extends from a top surface of the first portion toward the top surface of the fin. A width of the second portion decreases as the second portion extends from the top surface of the fin toward the substrate. In an embodiment, the first portion of the gate stack has a sloped sidewall. In an embodiment, the second portion of the gate stack has a sloped sidewall. In an embodiment, the second portion of the gate stack has a curved sidewall. In an embodiment, the curved sidewall is a concave sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
  forming a fin extending from a substrate;
  forming an isolation region adjacent the fin;
  forming a first gate layer over the fin and the isolation region;
  performing a patterning process on the first gate layer to form a first gate structure, wherein the patterning process exposes a top surface of the fin and a top surface of the isolation region, and wherein the patterning process forms the first gate structure with a footing portion extending along a sidewall of the fin and adjacent the isolation region, wherein a width of the first gate structure at the footing portion is greater than a width of the first gate structure at a point more distal from the isolation region; and
  performing a reshaping process on the first gate structure to form a reshaped gate structure, wherein the reshaping process removes the footing portion, and wherein the reshaped gate structure comprises:
    a first portion along the top surface of the fin, wherein a width of the first portion decreases as the first portion extends from a top surface of the first portion toward the top surface of the fin; and a second portion along the sidewall of the fin, wherein a width of the second portion decreases as the second portion extends from the top surface of the fin toward the substrate.

2. The method of claim 1, wherein the width of the second portion decreases as the second portion extends from the top surface of the isolation region.

3. The method of claim 1, wherein the patterning process and the reshaping process are different etch processes.

4. The method of claim 1, wherein the first gate structure is a dummy gate structure, further comprising, after performing the reshaping process:
forming a first gate spacer on a first sidewall of the first gate structure, the first gate spacer having a first outer sidewall facing away from the first gate structure; and
forming a second gate spacer on a second sidewall of the first gate structure, the second gate spacer having a second outer sidewall facing away from the first gate structure, wherein a first distance between the first outer sidewall and the second outer sidewall is greater than a second distance between the first outer sidewall and the second outer sidewall, wherein the first distance is along an upper area of the first gate structure, wherein the second distance is taken adjacent an upper surface of the fin.

5. The method of claim 1, wherein performing the reshaping process comprises a plasma etching process.

6. The method of claim 5, wherein the plasma etching process comprises a plasma generated from a gas mixture comprising chlorine.

7. The method of claim 6, wherein the plasma etching process is performed at a temperature in a range between 30° C. and 150° C., at a pressure in a range between $10^{-8}$ atm and $10^{-3}$ atm.

8. A method comprising:
forming a fin extending from a substrate;
forming an isolation region over the substrate and adjacent the fin, wherein the fin extends above a top surface of the isolation region;
depositing one or more layers along a sidewall and a top surface of the fin and along a top surface of the isolation region;
performing a first etch process on the one or more layers to form a first gate structure, wherein the first etch processes exposes the top surface of the isolation region, and wherein the first gate structure comprises a footing portion in physical contact with the top surface of the isolation region and a sidewall of the first gate structure; and
performing a second etch process on the first gate structure to form a reshaped gate structure, wherein the second etch process removes the footing portion, wherein the second etch process is different from the first etch process, and wherein the reshaped gate structure comprises:
a first portion along the top surface of the fin, wherein a first width of the first portion at a top surface of the first portion is greater than a second width of the first portion at the top surface of the fin; and
a second portion along the sidewall of the fin, wherein a third width of the second portion at the top surface of the fin is greater than a fourth width of the second portion at the top surface of the isolation region, wherein the second etch process thins the first portion and the second portion.

9. The method of claim 8, further comprising replacing the reshaped gate structure with a replacement gate structure.

10. The method of claim 8, wherein the second portion of the reshaped gate structure is curved.

11. The method of claim 10, further comprising forming spacers along opposing sidewalls of the reshaped gate structure, the spacers having outer sidewalls facing away from the reshaped gate structure, the outer sidewalls being concave.

12. The method of claim 11, wherein a width of the reshaped gate structure adjacent the isolation region is greater than a width of the reshaped gate structure at a point between the isolation region and an upper surface of the fin.

13. The method of claim 8, wherein the second etch process is a plasma etch process performed after the first etch process.

14. The method of claim 8, wherein the first gate structure at the footing portion has a wider width than the first gate structure at a point more distal from the isolation region.

15. A method comprising:
forming a fin extending from a substrate;
forming an isolation region adjacent the fin;
forming one or more layers over the fin and the isolation region;
performing a first etch process on the one or more layers to form a first gate structure, wherein the first etch process comprises a dry etch process performed with an etchant mixture comprising a Br-containing gas, a Cl-containing gas, a N-containing gas, a F-containing gas, an O-containing gas, or a combination thereof, wherein the first gate structure comprises a footing on the fin, a width of the first gate structure at the footing is greater than a width of the first gate structure at a point more distal from the isolation region; and
performing a second etch process on the first gate structure to form a reshaped gate structure, wherein the second etch process comprises a plasma etch process performed using a plasma generated from a gas mixture comprising chlorine gas ($CL_2$), and wherein the reshaped gate structure comprises:
a first portion along a top surface of the fin, wherein a width of the first portion decreases as the first portion extends from a top surface of the first portion toward the top surface of the fin; and
a second portion along a sidewall of the fin, wherein a width of the second portion decreases as the second portion extends from the top surface of the fin toward the substrate.

16. The method of claim 15, wherein the plasma etching process is performed at a temperature in a range between 30° C. and 150° C., and at a pressure in a range between $10^{-8}$ atm and $10^{-3}$ atm.

17. The method of claim 15, wherein the gas mixture further comprises $O_2$, $H_2$, Ar, $F_2$, $Br_2$, $N_2$, Xe, Kr, or a combination thereof.

18. The method of claim 15, wherein the width of the second portion decreases as the second portion extends from the top surface of the fin toward the substrate, and then increases adjacent an upper surface of the isolation region.

19. The method of claim 15, further comprising forming a spacer along a sidewall of the reshaped gate structure, the spacer having an outer sidewall, wherein the outer sidewall comprises an inward curving sidewall.

20. The method of claim 19, further comprising replacing the reshaped gate structure with a replacement gate structure.

\* \* \* \* \*